United States Patent
Momose et al.

(10) Patent No.: US 11,562,695 B2
(45) Date of Patent: Jan. 24, 2023

(54) ELECTRO-OPTICAL DEVICE AND ELECTRONIC APPARATUS

(71) Applicant: SEIKO EPSON CORPORATION, Tokyo (JP)

(72) Inventors: Yoichi Momose, Matsumoto (JP); Mitsutoshi Miyasaka, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/559,083

(22) Filed: Dec. 22, 2021

(65) Prior Publication Data

US 2022/0199021 A1 Jun. 23, 2022

(30) Foreign Application Priority Data

Dec. 23, 2020 (JP) .............................. JP2020-213290

(51) Int. Cl.
*G09G 3/3233* (2016.01)
*G09G 3/20* (2006.01)

(52) U.S. Cl.
CPC ......... *G09G 3/3233* (2013.01); *G09G 3/2007* (2013.01); *G09G 3/204* (2013.01); *G09G 2300/0842* (2013.01); *G09G 2310/08* (2013.01); *G09G 2330/021* (2013.01); *G09G 2340/0435* (2013.01); *G09G 2360/144* (2013.01)

(58) Field of Classification Search
None
See application file for complete search history.

(56) References Cited

U.S. PATENT DOCUMENTS

| 8,334,827 B2 * | 12/2012 | Seo ..................... G09G 3/3258 345/82 |
| 9,280,934 B2 | 3/2016 | Kawabe |
| 9,653,015 B2 | 5/2017 | Hu et al. |
| 10,147,349 B2 | 12/2018 | Hu et al. |

(Continued)

FOREIGN PATENT DOCUMENTS

| JP | 2004-086153 A | 3/2004 |
| JP | 2005-316382 A | 11/2005 |

(Continued)

OTHER PUBLICATIONS

Oct. 5, 2022 Office Action Issued In U.S. Appl. No. 17/556,432.

*Primary Examiner* — Dorothy Harris
(74) *Attorney, Agent, or Firm* — Oliff PLC

(57) ABSTRACT

An electro-optical device includes a plurality of digital scanning lines, a digital signal line, and a plurality of pixel circuits. Each of the pixel circuits includes a light emitting element and a digital driving circuit. The digital driving circuit performs digital driving to turn the light emitting element ON-state or OFF-state based on a grayscale value. The digital driving circuit keeps the light emitting element ON-state by supplying a drive current to the light emitting element, in a period in which an enable signal is active, of a grayscale display period having a length corresponding to the grayscale value. The control line driving circuit sets a period in which the enable signal is active. A ratio, with respect to the grayscale display period, of an ON-state period in which the light emitting element is ON-state changes in accordance with the period in which the enable signal is active.

14 Claims, 18 Drawing Sheets

(56) References Cited

U.S. PATENT DOCUMENTS

| | | |
|---|---|---|
| 10,147,350 B2 | 12/2018 | Hu et al. |
| 10,311,773 B2 | 6/2019 | Hu et al. |
| 10,847,077 B2 | 11/2020 | Sakariya et al. |
| 11,138,918 B2 | 10/2021 | Sakariya et al. |
| 2004/0013427 A1* | 1/2004 | Ito ........................ G09G 3/3659 398/42 |
| 2005/0243077 A1* | 11/2005 | Chung ................ G09G 3/3258 345/204 |
| 2006/0244697 A1* | 11/2006 | Lee ...................... G09G 3/3233 345/77 |
| 2009/0102749 A1 | 4/2009 | Kawabe |
| 2019/0235250 A1 | 8/2019 | Miyasaka et al. |
| 2019/0347981 A1* | 11/2019 | Horowitz ............. H04N 9/3135 |

FOREIGN PATENT DOCUMENTS

| | | |
|---|---|---|
| JP | 2008-281827 A | 11/2008 |
| JP | 2013-104910 A | 5/2013 |
| JP | 2019-132941 A | 8/2019 |
| JP | 2020-064159 A | 4/2020 |
| JP | 2020-095107 A | 6/2020 |

\* cited by examiner

ELECTRO-OPTICAL DEVICE AND ELECTRONIC APPARATUS

The present application is based on, and claims priority from JP Application Serial Number 2020-213290, filed Dec. 23, 2020, the disclosure of which is hereby incorporated by reference herein in its entirety.

BACKGROUND

1. Technical Field

The present disclosure relates to an electro-optical device and an electronic apparatus.

2. Related Art

JP-A-2019-132941 and JP-A-2008-281827 disclose a technique in which, in a display device using a light emitting element in a pixel, by causing the pixel to emit light only for a time that has been weighted in accordance with each of bits of display data, grayscale display is performed as a time average. Further, in JP-A-2019-132941 and JP-A-2008-281827, a technique is disclosed in which, while a plurality of scanning lines are selected sequentially one by one in descending order, a first bit is set to a pixel electrically connected to each of the scanning lines. Subsequently, while the plurality of scanning lines are selected sequentially one by one in descending order in the same manner, a second bit is set to the pixel electrically connected to each of the scanning lines, and this is continued up to the MSB.

In a head-mounted display, a head-up display, or the like, a user may sometimes wish to adjust a display luminance to match a brightness of the environment. However, in the above-mentioned JP-A-2019-132941 and JP-A-2008-281827, since the grayscale display is performed using a length of an overall light emitting period in a single frame by causing the light-emitting element to emit light or not emit light for a time period weighted in accordance with each of the bits of the display data, a light emitting luminance at a maximum gradation is fixed. In order to adjust the display luminance to match the brightness of the environment, it is necessary to perform the display with the maximum gradation as the maximum luminance in a bright environment, and with a gradation lower than the maximum gradation as the maximum luminance in a dark environment. As a result, there is a problem in that adjustment of the display luminance in accordance with the brightness of the environment and a favorable grayscale display cannot both be achieved simultaneously.

SUMMARY

According to an aspect of the present disclosure, an electro-optical device includes a plurality of digital scanning lines, a digital signal line, a plurality of pixel circuits, and a control line driving circuit configured to output an enable signal. Each pixel circuit of the plurality of pixel circuits includes a light emitting element, and a digital driving circuit configured to perform digital driving in which display data is set from the digital signal line when the digital driving circuit is selected by the digital scanning line, and the light emitting element is ON-state or OFF-state based on a grayscale value of the display data. Each pixel circuit is electrically connected to a digital scanning line included in the plurality of digital scanning lines, and to the digital signal line. The digital driving circuit keeps the light emitting element ON-state by supplying a drive current to the light emitting element, in a period in which the enable signal is active, of a grayscale display period having a length corresponding to the grayscale value of the display data. The control line driving circuit variably sets the period in which the enable signal is active. A ratio, with respect to the grayscale display period, of an ON-state period in which the light emitting element is ON-state changes in accordance with the period in which the enable signal is active.

Further, according to another aspect of the present disclosure, an electronic apparatus includes the above electro-optical device.

BRIEF DESCRIPTION OF THE DRAWINGS

FIG. 8 is a first example of a scanning line selection order.

FIG. 16 is a fourth example of the scanning line selection order.

DESCRIPTION OF EMBODIMENTS

An embodiment of the present disclosure will be described in detail below. Note that the embodiment described below is not intended to wrongfully limit the content of the present disclosure as set forth in the claims, and all configurations described in the embodiment are not necessarily required constituent elements.

1. As described above, with respect to display luminance adjustment in accordance with the brightness of the environment, in the case of a head-mounted display, a head-up display, or the like, there are cases where a user wishes to adjust the display luminance in accordance with the brightness of the environment. Issues relating to the display luminance adjustment are described using analog driving and digital driving as examples.

Figure 1:
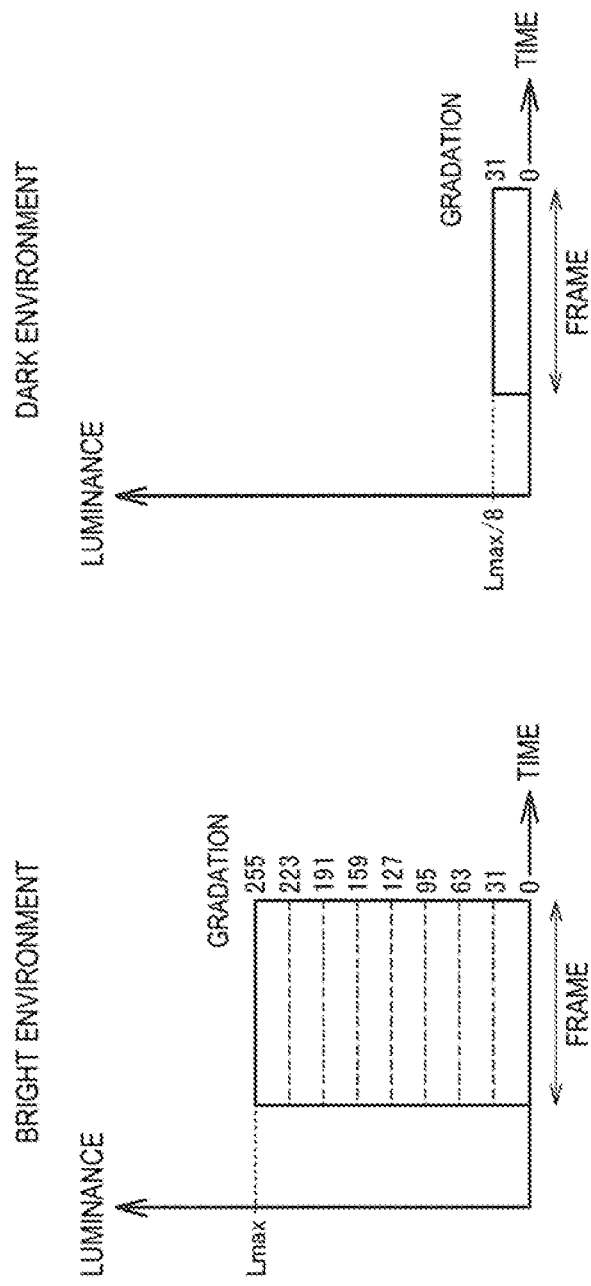
FIG. 1 is a diagram illustrating display luminance adjustment when performing display by analog driving.

FIG. 1 is a diagram illustrating display luminance adjustment when performing the display using the analog driving. In the analog driving, a pixel circuit causes a drive current corresponding to a grayscale value to flow to a light emitting element. Since the drive current is constant in one frame, the light emitting element continues to emit light at the same luminance in the one frame. Here, a range of the grayscale values is assumed to be from 0 to 255.

As illustrated in the diagram on the left side, the display is performed using all the grayscale values of 0 to 255 in a bright environment, and thus, when the grayscale value is 255, the light emitting element emits the light at a maximum luminance. This maximum luminance is denoted by Lmax. As illustrated in the diagram on the right side, it is assumed that, in a dark environment, the maximum luminance is adjusted to Lmax/8. Since the luminance Lmax/8 corresponds to the grayscale value of 31, the display is performed using the grayscale values of 0 to 31, and a favorable grayscale display cannot be maintained in the dark environment.

Note that when the maximum luminance is lowered while maintaining a number of gradations by reducing the drive current at the grayscale value 255, the drive current at the lower gradations becomes extremely small. In order to cause the light emitting element to emit the light in a stable manner, a certain amount of current is necessary, and it is thus not possible to significantly reduce the drive current while maintaining the number of gradations. In order to deal with the bright environment and the dark environment, it is conceivable, for example, that a several ten-fold to several hundred-fold display luminance difference is necessary, but in the analog driving, it is difficult to deal with the several ten-fold to several hundred-fold display luminance difference while maintaining the number of gradations.

Figure 2:
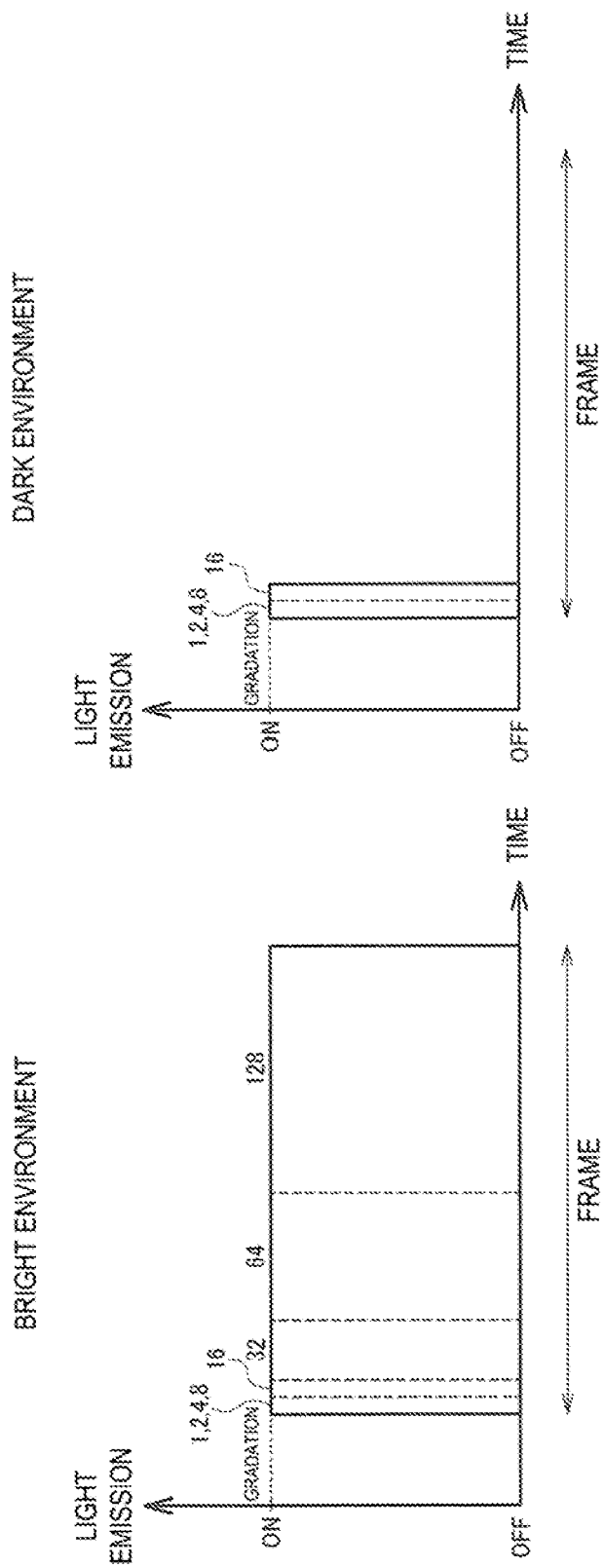
FIG. 2 is a diagram illustrating the display luminance adjustment when performing display by digital driving.

FIG. 2 is a diagram illustrating the display luminance adjustment when performing the display by digital driving. In the digital driving, the pixel circuit causes the light emitting element to emit the light in a display period of a length corresponding to the grayscale value, in one frame. Here, a range of the grayscale values is assumed to be from 0 to 255.

In FIG. 2, ON means light emission, and OFF means no light emission, and the one frame is constituted only by the two states of light emission and no light emission. A light-emitting luminance is fixed during the ON-state period. An interval delineated by dotted lines is a display period, and a numeral above that interval is the grayscale value corresponding to that display period. The display periods corresponding to the grayscale values of 1, 2, 4, 8, 16, 32, 64, and 128 are provided, and a length of the display period is weighted by a power of two. For example, when the grayscale value is 81=1+16+64, the light emitting element emits the light in the display period corresponding to the grayscale values 1, 16, and 64, and the light emitting element is turned off during the other display periods. Note that the display periods corresponding to the grayscale values 1, 2, 4, and 8 are illustrated in the single interval, but in reality, the display period is provided for each of the grayscale values.

As illustrated in the diagram on the left side, the display is performed using all the grayscale values of 0 to 255 in the bright environment, and thus, when the grayscale value is 255, the light emitting element emits the light for the entire display period This state is the maximum luminance in the bright environment. As illustrated in the diagram on the right side, it is assumed that, in the dark environment, the maximum luminance is adjusted to ⅛ of the maximum luminance. Since ⅛ of the maximum luminance of the bright environment corresponds to the grayscale value of 31, the display is performed using the grayscale values of 0 to 31, and the favorable grayscale display cannot be maintained in the dark environment.

As described above, there is an issue in that, in the known analog driving and digital driving, the adjustment of the display luminance in accordance with the brightness of the environment and the favorable grayscale display cannot both be achieved simultaneously.

2. First Configuration Example of Electro-Optical Device and Display System

Figure 3:
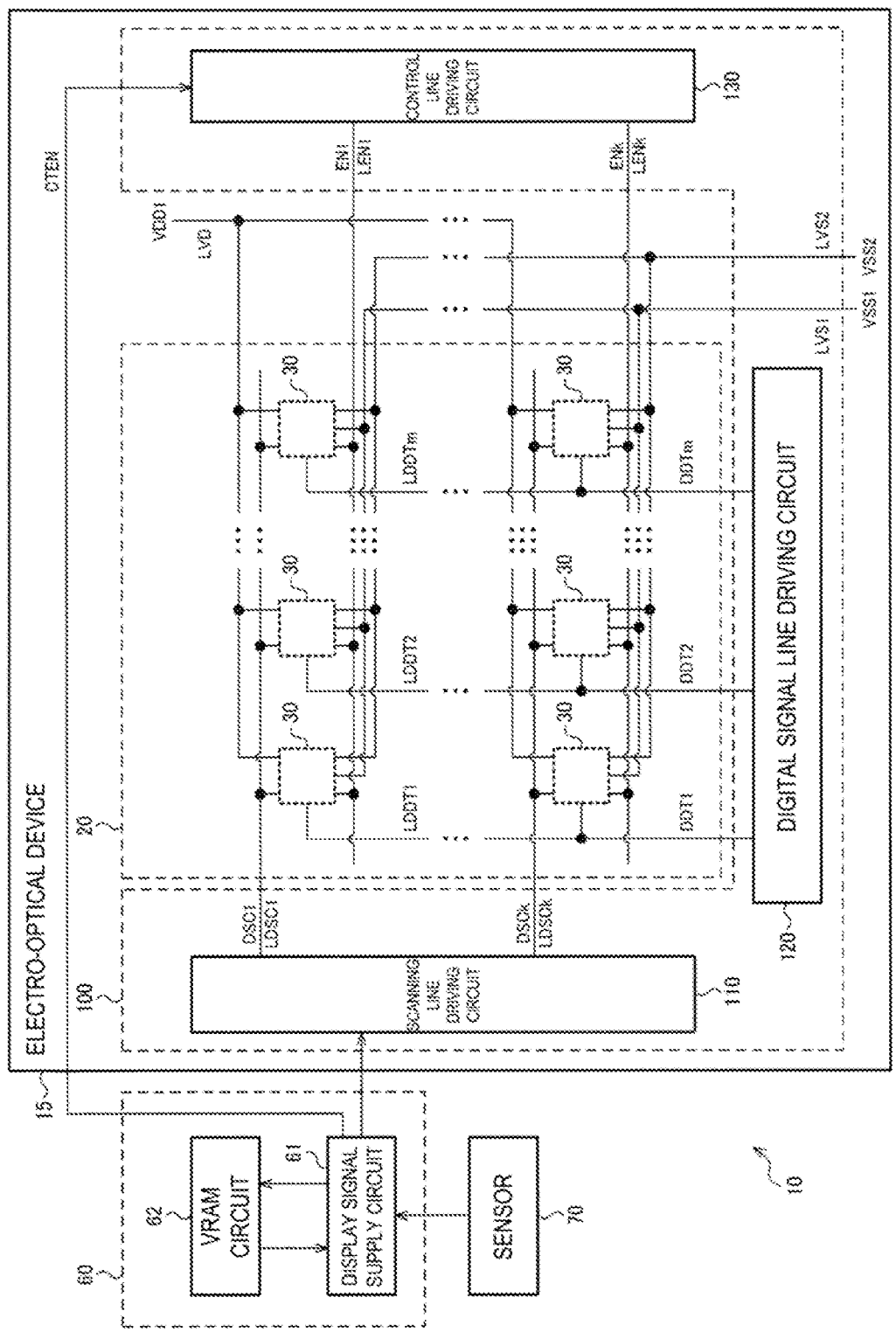
FIG. 3 is a first configuration example of an electro-optical device and a display system.

FIG. 3 is a first configuration example of an electro-optical device 15 and a display system 10 according to the embodiment. The display system 10 includes a display controller 60 and the electro-optical device 15. The electro-optical device 15 includes a circuit device 100 and a pixel array 20.

The display controller 60 outputs display data to the circuit device 100 and performs display timing control. The display controller 60 includes a display signal supply circuit 61 and a VRAM circuit 62.

The VRAM circuit 62 stores the display data to be displayed in the pixel array 20. For example, when the VRAM circuit 62 stores image data for one image, the VRAM circuit 62 stores the display data one bit at a time corresponding to each of pixels of the pixel array 20.

The display signal supply circuit 61 generates a control signal for controlling the display timing. The control signal is, for example, a vertical synchronization signal, a horizontal synchronization signal, a clock signal, and the like. The display signal supply circuit 61 reads the display data from the VRAM circuit 62 in accordance with the display timing, and outputs that display data and the control signal to the circuit device 100. Further, the display signal supply circuit 61 outputs ratio setting information CTEN to the circuit device 100 based on luminance information of the environment. A sensor 70 is a sensor that detects the luminance information of the environment, and is a photodiode or an image sensor, for example. The display signal supply circuit 61 controls the ratio setting information CTEN so that the ON-state period of the light emitting element becomes shorter the lower the brightness of the environment. Note that although an example has been described here in which the display signal supply circuit 61 outputs the ratio setting information CTEN, a microcomputer or the like built into the electronic apparatus in which the electro-optical device 15 is installed may output the ratio setting information CTEN.

The electro-optical device 15 is, for example, an organic EL display element or a micro LED display element. Alternatively, the electro-optical apparatus 15 may be a quantum dot display element or a DMD display element. The electro-optical device 15 is also referred to as an electro-optical element, a display element, an electro-optical panel, a display panel, an electro-optical device, or a display device. The electro-optical device 15 includes a semiconductor substrate (not illustrated), and the pixel array 20 and the circuit device 100 are formed on the semiconductor substrate. Note that the pixel array 20 may be formed on a glass substrate, and the circuit device 100 may be configured by an integrated circuit device.

The circuit device 100 drives the pixel array 20 based on the display data and the control signal from the display controller 60, to cause the pixel array 20 to display the image. The circuit device 100 includes a scanning line driving circuit 110, a digital signal line driving circuit 120, and a control line driving circuit 130.

The pixel array 20 includes a plurality of the pixel circuits 30 arranged in a matrix of k rows and m columns. k and m are integers equal to or greater than 2 Further, the pixel array 20 includes digital scanning lines LDSC1 to LDSCk, enable signal lines LEN1 to LENk, digital signal lines LDDT1 to LDDTm, a power source line LVD, and ground lines LVS1 and LVS2.

The digital scanning line LDSC1 and the enable signal line LEN1 are electrically connected to the pixel circuits 30 in the first row. The scanning line driving circuit 110 outputs a digital selection signal DSC1 to the digital scanning line LDSC1. The control line driving circuit 130 outputs an enable signal EN1 to the enable signal line LEN1. Similarly, the digital scanning lines LDSC2 to LDSCk and the enable signal lines LEN2 to LENk are electrically connected to the pixel circuits 30 in the second to k-th rows. The scanning line driving circuit 110 outputs digital selection signals DSC2 to DSCk to the digital scanning lines LDSC2 to LDSCk. The control line driving circuit 130 outputs enable signals EN2 to ENk to the enable signal lines LEN2 to LENk.

The digital signal line LDDT1 is electrically connected to the pixel circuits 30 in the first column. The digital signal line driving circuit 120 outputs a digital data signal DDT1 to the digital signal line LDDT1. The digital data signal DDT1 is a signal of any one of nbits of the display data. Similarly, the digital signal lines LDDT2 to LDDTm are electrically connected to the pixel circuits 30 in the second to m-th columns. The digital signal line driving circuit 120 outputs digital data signals DDT2 to DTm to the digital signal lines LDDT2 to LDDTm.

Here, the threshold compensation is to compensate for variations in the drive current by compensating for threshold variation in a transistor that generates the drive current of the light emitting device. An analog driving circuit 35 stores k×m compensation values corresponding to the k rows and m columns of the pixel circuits 30, and generates analog data voltages ADT1 to ADTm by compensating for an analog data voltage VADT using the m compensation values corresponding to the m pixel circuits 30 electrically connected to the selected analog scanning lines.

The power source line LVD and the ground lines LVS1 and LVS2 are electrically connected to all the pixel circuits 30. A power supply voltage VDD is supplied to the power source line LVD from a power supply circuit (not illustrated). A first ground voltage VSS1 is supplied to the first ground line LVS1 from the power supply circuit (not illustrated), and a second ground voltage VSS2 is supplied to the second ground line LVS2 from the power supply circuit (not illustrated). Note that the ground lines LVS1 and LVS2 may be a single common ground line.

Figure 4:
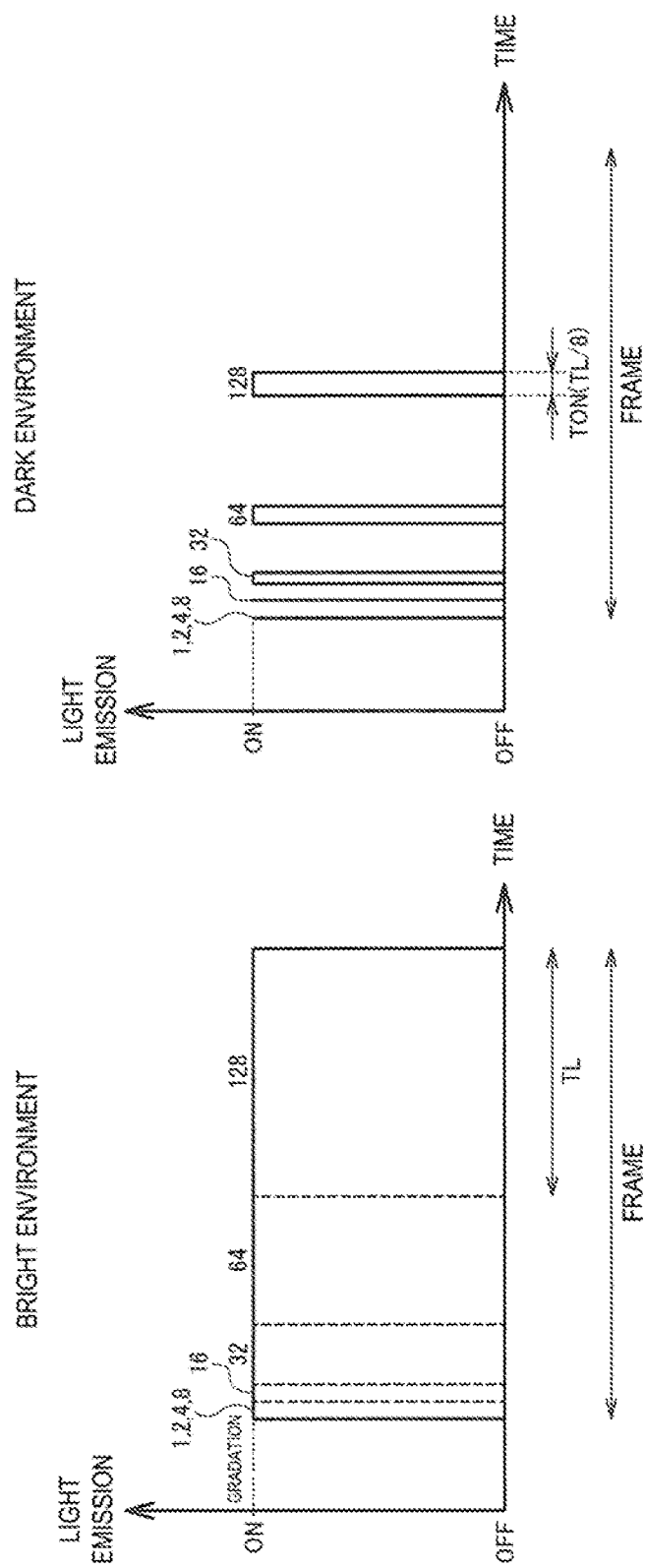
FIG. 4 is a diagram illustrating the display luminance adjustment according to an embodiment.

FIG. 4 is a diagram illustrating the display luminance adjustment according to the embodiment. As illustrated in the diagram on the left side, similarly to the digital driving described with reference to FIG. 2, in the bright environment, the pixel circuit 30 causes a light emitting element to emit light in the display period of the length corresponding to the grayscale value, in one frame. The meaning of the numeral indicating the grayscale value, the fact that the interval delineated by dotted lines indicates the display period, and the fact that the length of the display period is weighted by the power of two are the same as in FIG. 2.

As illustrated in the diagram on the right side, in the dark environment, the pixel circuit 30 causes the light emitting element to emit light in some of ON-state periods TON, of the display periods corresponding to each of the grayscale values. By controlling an active period of the enable signal EN based on the ratio setting information CTEN, the control line driving circuit 130 controls the ON-state period TON in which the light emitting element is caused to emit light. For example, it is assumed that when the length of the display period corresponding to the grayscale value 128 is TL, the pixel circuit 30 causes the light emitting element to emit light in the ON-state period TON of a length TL/8, of the display period TL. In the display periods corresponding to the other grayscale values of 1, 2, 4, 8, 16, 32, and 64 also, the pixel circuit 30 causes the light emitting element to emit light in a period that is ⅛ of that display period. In this way, in a time average within one frame, the light emission luminance in the dark environment is ⅛ of the light emission luminance in the bright environment. Note that the ON-state periods TON corresponding to the grayscale values 1, 2, 4, and 8 are illustrated as a single interval, but in reality, the ON-state period TON is provided with respect to each of the grayscale values.

Figure 5:
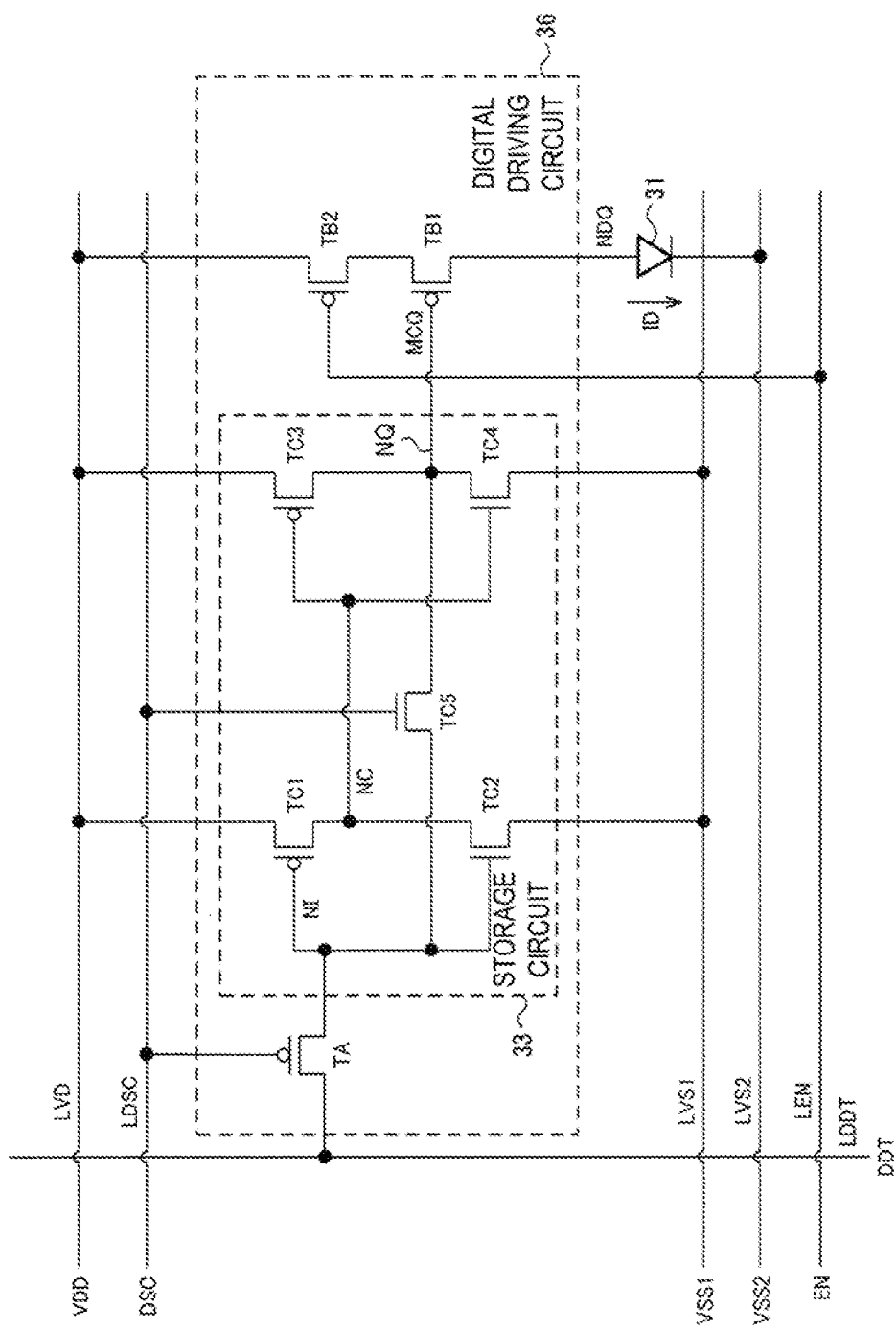
FIG. 5 is a first configuration example of a pixel circuit.

FIG. 5 is a first configuration example of the pixel circuit 30. The pixel circuit 30 includes a digital driving circuit 36, and a light emitting element 31. Note that in FIG. 5, in relation to DSC1 to DSCk, DDT1 to DDTm, and the like, 1 to k and 1 to m are omitted. For example, DSC refers to any one of DSC1 to DSCk.

Hereinafter, an example is described in which the digital driving circuit 36 and the light emitting element 31 are electrically connected side by side in that order, from the power source to the ground. However, the light emitting element 31, and the digital driving circuit 36 may be electrically connected side by side in that order, from the power source to the ground.

The digital driving circuit 36 captures the digital data signal DDT when the digital scanning line LDSC is selected and stores that digital data signal DDT. The digital driving circuit 36 causes the drive current to flow from the power source LVD to a node NDQ when the digital data signal DDT and the enable signal EN are active, and blocks the drive current when at least one of the digital data signal DDT or the enable signal EN is inactive. Note that in the following description, it is assumed that an active bit is "0" or low level, and an inactive bit is "1" or high level.

The light emitting element 31 is, for example, an OLED or a micro LED. OLED is an abbreviation for Organic Light Emitting Diode, and LED is an abbreviation for Light Emitting Diode. The micro LED is an inorganic LED integrated on a substrate. The anode of the light emitting element 31 is electrically connected to the node NDQ, and the cathode is electrically connected to the second ground line LVS2. When the digital data signal DDT stored in the digital driving circuit 36 is "0", and the enable signal EN is active, the drive current flows to the light emitting element 31, and the light emitting element 31 emits light at a luminance corresponding to the current value of the drive current. When the digital data signal DDT stored in the digital driving circuit 36 is "1", the light emitting element 31 is turned off. Note that in the following description, when the light emitting element 31 is in a light-emitting state, this is also referred to as being "ON-state", and when the light emitting element 31 is in a turned off state, this is also referred to as being "OFF-state".

A detailed configuration example of the digital driving circuit 36 will be described. The digital driving circuit 36 includes a storage circuit 33 and P-type transistors TA, TB1, and TB2.

One of the source or drain of the P-type transistor TA is electrically connected to the digital signal line LDDT, the other of the source or drain is electrically connected to an input node NI of the storage circuit 33, and the gate is electrically connected to the digital scanning line LDSC.

The source of the P-type transistor TB2 is electrically connected to the power source LVD, the drain is electrically connected to the source of the transistor TB1, and the gate is electrically connected to the enable signal line LEN. The drain of the P-type transistor TB1 is electrically connected to the node NDQ, and the gate is electrically connected to an output node NQ of the storage circuit 33. The P-type transistor TB1 and the P-type transistor TB2 are provided in series between the power source line LVD, which is the drive current supply node, and one end of the light emitting element 31. The P-type transistor TB1 is a first drive transistor, is turned on or off based on an output signal MCQ from the storage circuit 33. The P-type transistor TB2 is a second drive transistor, and is turned on or off based on the enable signal EN. When the P-type transistor TB1 and the P-type transistor TB2 are ON-state, the drive current is supplied to the light emitting element 31.

The storage circuit 33 is a memory cell that stores one bit of data. The storage circuit 33 stores the digital data signal DDT input from the digital signal line LDDT to the input node NI when the P-type transistor TA is ON-state, and outputs the stored signal to the output node NQ as the output signal MCQ. The storage circuit 33 includes P-type transistors TC1 and TC3, and N-type transistors TC2, TC4, and TC5.

The P-type transistor TC1 and the N-type transistor TC2 constitute a first inverter, and the P-type transistor TC3 and the N-type transistor TC4 constitute a second inverter. A power supply voltage VDD and a first ground voltage VSS1 are supplied to the first inverter and the second inverter. An input node of the first inverter is electrically connected to the input node NI of the storage circuit 33, an output node NC of the first inverter is electrically connected to an input node of the second inverter, and an output node of the second inverter is electrically connected to the output node NQ of the storage circuit 33. One of the source or drain of the N-type transistor TC5 is electrically connected to the input node NI, and the other of the source or drain is electrically connected to the output node NQ.

When "0" is set to the storage circuit 33, the output signal MCQ is at the low level, and when "1" is set, the output signal MCQ is at the high level. When the output signal MCQ and an enable signal EN of the storage circuit 33 are at the low level, the P-type transistors TB1 and TB2 are ON-state, a drive current ID flows to the light emitting element 31, and the light emitting element 31 emits light. When at least one of the output signal MCQ or the enable signal EN of the storage circuit 33 is at the high level, at least one of the P-type transistors TB1 or TB2 is OFF-state, the drive current ID does not flow to the light emitting element 31, and the light emitting element 31 is turned off.

Note that the configuration of the digital driving circuit 36 is not limited to that illustrated in FIG. 5. For example, a capacitor may be provided in place of the storage circuit 33, and the capacitor may hold the digital data signal DDT. Alternatively, the N-type transistor TC5 of the storage circuit 33 may be omitted, and the input node NI of the first inverter and the output node NQ of the second inverter may be directly electrically connected to each other Alternatively, the ground lines LVS1 and LVS2 may be the common ground line, and the ground voltage may be supplied to the light emitting element 31 and the storage circuit 33 from the common ground line.

Figure 6:
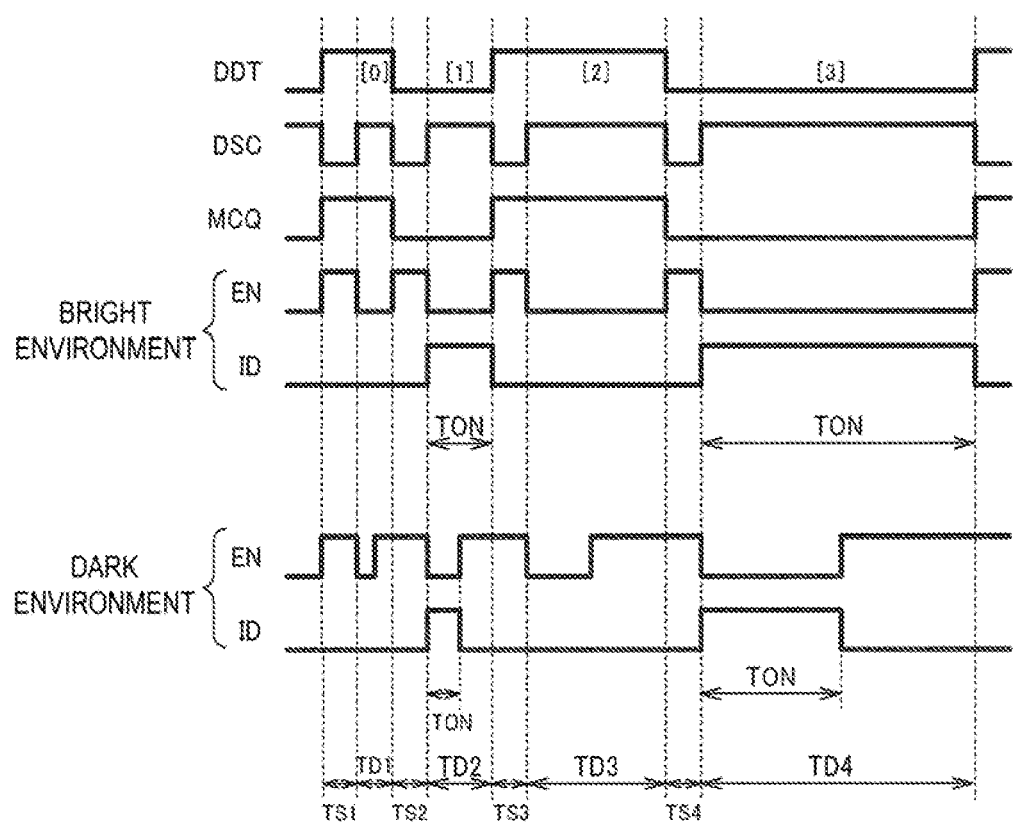
FIG. 6 is a diagram illustrating a first operation example of the first configuration example of the pixel circuit.

FIG. 6 is a diagram illustrating a first operation example of the pixel circuit 30. FIG. 6 illustrates an example in which the light emission luminance in the dark environment is ½ the light emission luminance in the bright environment. Here, an example will be given when a first bit of the display data is DDT [0]=1, a second bit is DDT [1]=0, a third bit is DDT [2]=1, and a fourth bit is DDT [3]=0.

First, operations in the bright environment will be described. In a scanning line selection period TS1, the digital selection signal DSC is at the low level. At this time, the P-type transistor TA of the digital driving circuit 36 is ON-state, and the N-type transistor TC5 is OFF-state. In this way, the first bit DDT [0]=1 is input to the storage circuit 33, and the storage circuit 33 outputs the high level output signal MCQ. The enable signal EN is at the high level. As a result of the above, the P-type transistors TB1 and TB2 are OFF-state, and thus the light emitting element 31 is turned off.

In a display period TD1, the digital selection signal DSC is at the high level. At this time, the P-type transistor TA is OFF-state, and the N-type transistor TC5 is ON-state. In this way, the storage circuit 33 holds the first bit DDT [0]=1, and holds the output signal MCQ at the high level. The enable signal EN is at the low level. As a result of the above, the P-type transistor TB1 is OFF-state and the P-type transistor TB2 is ON-state, and thus the light emitting element 31 is turned off.

In a scanning line selection period TS2 and a display period TD2, the pixel circuit 30 operates in the same manner as described above. However, since DDT [1]=0, the light emitting element 31 is ON-state in the display period TD2. Similarly, since DDT [2]=1 and DDT [3]=0, the light emitting element 31 is turned off and on in display periods TD3 and TD4.

The length of the display period TD2 is twice the length of the display period TD1. Similarly, the lengths of the display periods TD3 and TD4 are twice the lengths of the display periods TD2 and TD3. In other words, the display periods TD1, TD2, TD3, and TD4 have a length proportional to the grayscale values 1, 2, 4, and 8 of the first, second, third, and fourth bits.

Next, operations in the dark environment will be described. The operations in the scanning line selection periods TS1 to TS4 are the same as for the bright environment. In the display period TD1, the control line driving circuit 130 sets the enable signal EN to the low level in a period of ½ the display period TD1. Similarly, in the display periods TD2 to TD4, the control line driving circuit 130 sets the enable signal EN to the low level in a period of ½ the display periods TD2 to TD4.

When the output signal MCQ of the storage circuit 33 is at the low level and the enable signal EN is at the low level, the P-type transistor TB1 and the P-type transistor TB2 of the digital driving circuit 36 are both on, and thus the light emitting element 31 is ON-state in the periods that are ½ of each of the display periods TD2 and TD4.

In the bright environment, the ON-state period TON in which the light emitting element 31 emits light is all of the display periods TD2 and TD4. On the other hand, in the dark environment, the ON-state period TON in which the light emitting element 31 emits light is ½ of each of the display periods TD2 and TD4. In this way, the light emission luminance in the dark environment is ½ the light emission luminance in the bright environment.

Figure 7:
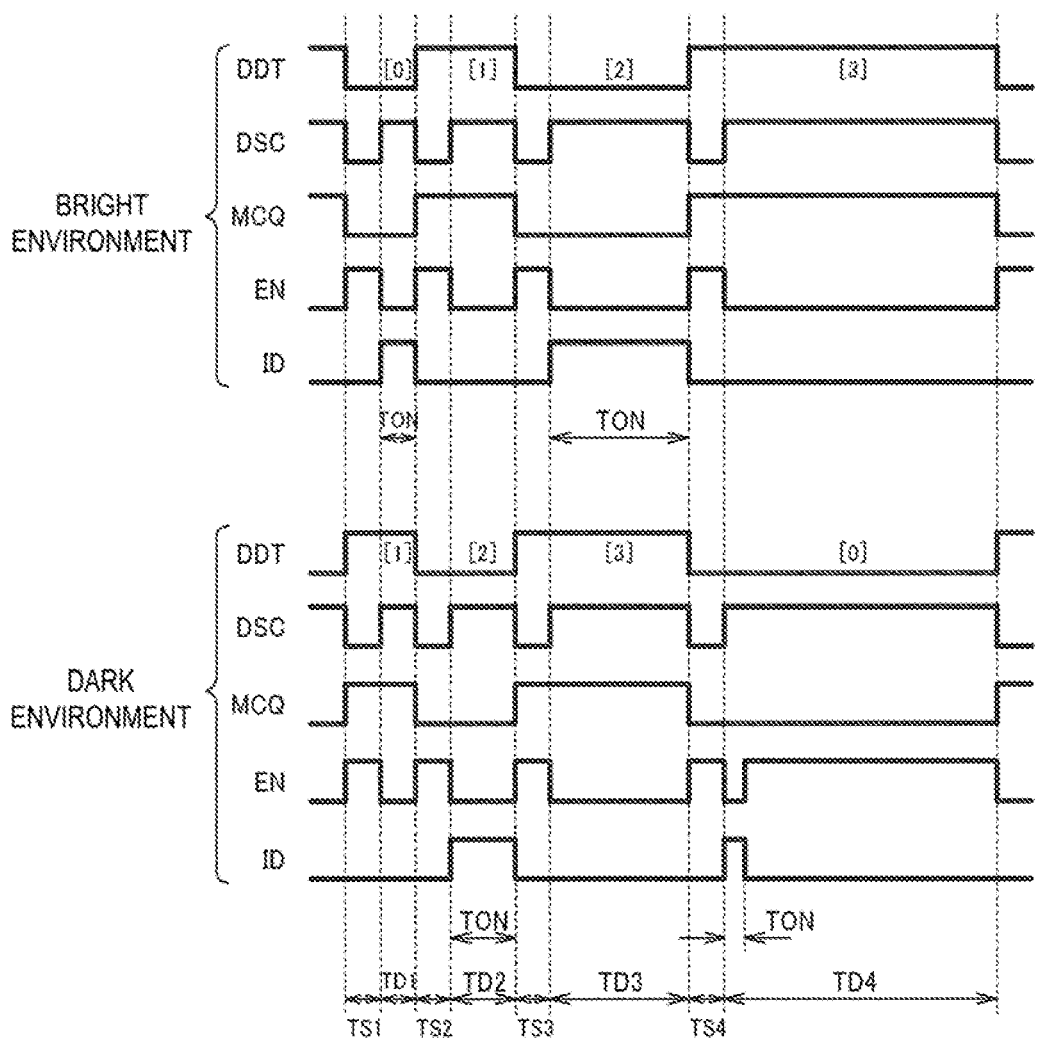
FIG. 7 is a diagram illustrating a second operation example of the first configuration example of the pixel circuit.

FIG. 7 is a diagram illustrating a second operation example of the pixel circuit 30. FIG. 7 illustrates an example in which the light emission luminance in the dark environment is ½ the light emission luminance in the bright environment. Here, an example will be described in which the first bit of the display data is DDT [0]=1, the second bit is DDT [1]=1, the third bit is DDT [2]=0, and the fourth bit is DDT [3]=1.

In the bright environment, the light emitting element 31 emits light in the display periods TD1 and TD3 by the same operations as illustrated in FIG. 6. Note that the logic of the bits of the display data is opposite to that illustrated in FIG. 6, and thus the ON-state period TON is the display periods TD1 and TD3.

In the dark environment, in the scanning line selection period TS1, the digital signal line driving circuit 120 outputs the second bit DDT [1]=1 and the storage circuit 33 holds the second bit DDT [1]=1. Similarly, in the scanning line selection periods TS2, TS3, and TS4, the digital signal line driving circuit 120 outputs the third bit DDT [2]=0, the fourth bit DDT [3]=1, and the first bit DDT [0]=0, and the storage circuit 33 holds the third bit DDT [2]=0, the fourth bit DDT [3]=1, and the first bit DDT [0]=0.

The control line driving circuit 130 sets the enable signal EN to the low level in the display periods TD1, TD2, and TD3, but in the display period TD4, sets the enable signal EN to the low level in a period 1/16 of the length of the display period TD4.

The ON-state period TON in the bright environment is the display period TD1 and the display period TD3. On the other hand, the ON-state period TON in the dark environment is 1/16 of the display period TD4, and the display period TD2. 1/16 of the length of the display period TD4 is ½ of the length of the display period TD1, and the length of the display period TD2 is ½ of the length of the display period TD3. In this way, the light emission luminance in the dark environment is ½ the light emission luminance in the bright environment.

In the embodiment described above, the electro-optical device 15 includes the plurality of digital scanning lines LDSC1 to LDSCk, the digital signal line LDDT, and the plurality of pixel circuits 30. The digital signal line LDDT is anyone of LDDT1 to LDDTk. Each of the pixel circuits 30 is electrically connected to the digital scanning line LDSC included in the plurality of digital scanning lines LDSC1 to LDSCk, and the digital signal line LDDT. The digital scanning line LDSC is any one of LDSC1 to LDSCk.

Each of the pixel circuits 30 includes the light emitting element 31 and the digital driving circuit 36. When the digital driving circuit 36 is selected by the digital scanning line LDSC, the display data is set from the digital signal line LDDT, and the digital driving circuit 36 turns the light emitting element 31 ON-state or OFF-state based on the grayscale value of that display data. This is referred to as the digital driving. The digital driving circuit 36 turns the light emitting element 31 on by supplying the drive current to the light emitting element 31 in a period in which the enable signal EN is active, of the grayscale display period having a length corresponding to the grayscale value of the display data. The control line driving circuit 130 variably sets the period in which the enable signal EN is active. The ratio, with respect to the grayscale display period, of the ON-state period TON in which the light emitting element 31 is turned on varies in accordance with the period in which the enable signal EN is active. In FIG. 6, the grayscale display period is a period of a length obtained by combining the display periods T2 and T4, and in FIG. 7, the grayscale display period is a period of a length obtained by combining the display periods T1 and T3. In the dark environment in FIG. 7, the ON-state period TON is present in the display periods T2 and T4, but a reference for the length of that ON-state period TON is the length obtained by combining the display periods T1 and T3. A period that is the reference for the length of the ON-state period TON is assumed to be the grayscale display period.

According to the embodiment, in the digital driving, of the grayscale display period having the length corresponding to the grayscale value of the display data, the light emitting element 31 is ON-state in the ON-state period TON of the ratio set by the control line driving circuit 130. In this way, the display luminance is adjusted by adjusting the ratio of the ON-state period TON with respect to the grayscale display period, and it is thus possible to also use all the grayscale values 0 to 255 in the dark environment. As a result, the adjustment of the display luminance in accordance with the brightness of the environment and the favorable grayscale display can both be achieved simultaneously.

Further, according to the embodiment, in order to adjust the length of the ON-state period in which the light emitting element 31 emits light by controlling the digital driving and the enable signal EN, simply by using a known digital driving pixel circuit and changing digital processing of the driving, for example, the adjustment of the display luminance in accordance with the brightness of the environment and the favorable grayscale display can both be achieved simultaneously.

Further, according to the embodiment, since the display luminance is adjusted only by turning the light emitting element 31 ON-state and OFF-state, the current flowing to the light emitting element does not change when the light emitting element 31 is ON-state. In this way, it is possible to cause the sufficient drive current to flow to the light emitting element 31 to emit light in a stable manner, even in the dark environment.

Further, in the embodiment, the electro-optical device 15 includes the scanning line driving circuit 110 that drives the plurality of digital scanning lines LDSC1 to LDSCk. A field constituting a single image includes first to n-th scanning line selection periods in which first to n-th bits of display data are set to the pixel circuit 30, and first to n-th display periods in which the light emitting element 31 is ON-state or OFF-state in accordance with the first to n-th bits set to the pixel circuit 30. n is an integer equal to or greater than 2. Of the first to n-th display periods, the grayscale display period of the length corresponding to the grayscale value of the display data is a display period corresponding to the scanning line selection period to which the bit indicating ON-state for the light emitting element 31 is set.

In the example illustrated in FIG. 6, n=4, TS1 to TS4 correspond to the first to fourth scanning line selection periods, and TD1 to TD4 correspond to the first to fourth display periods. The bit indicating ON-state for the light emitting element 31 is "0". In other words, the period of the length obtained by combining the second display period TD2 and the fourth display period TD4 is the grayscale display period of the length corresponding to the grayscale value of the display data. In the example illustrated in FIG. 7, the period of the length obtained by combining the first display period TD1 and the third display period TD3 is the grayscale display period of the length corresponding to the grayscale value of the display data.

According to the embodiment, the display period corresponding to the scanning line selection period in which is set the bit indicating that the light emitting element 31 is ON-state indicates the period in which the light emitting element 31 is ON-state, in the normal digital driving. In the embodiment, of those grayscale display periods, the light emitting element 31 is turned on in the ON-state period TON of the ratio set by the control line driving circuit 130. In this way, it is possible to adjust the display luminance while securing the number of gradations of the grayscale display in the digital driving.

Further, in the embodiment, the control line driving circuit 130 activates the enable signal EN at the above-described ratio in each display period of the first to the n-th display periods.

This corresponds to FIG. 6, and in each display period of the display periods TD1 to TD4, the enable signal EN is active at the ratio of 1/2.

According to the embodiment, a period that is the display period corresponding to the scanning line selection period in which is set the bit indicating that the light emitting element 31 is ON-state, and, of those display periods, is the period in which the enable signal EN is active at the ratio set by the control line driving circuit 130, is the ON-state period TON in which the light emitting element 31 is turned on. The ratio occupied by the ON-state period in each of the display periods is constant, and, by adjusting that ratio, the length of the ON-state period TON is adjusted and the display luminance is adjusted.

Further, in the embodiment, the electro-optical device 15 includes the digital signal line driving circuit 120 that outputs the first to n-th bits to the digital signal line LDDT. The digital signal line driving circuit 120 changes an allocation of which bit, of the first to n-th bits, is set to the pixel circuit 30 in each of the scanning line selection periods, of the first to n-th scanning line selection periods, in accordance with the above-described ratio. The control line driving circuit 130 activates the enable signal EN in the period of the length corresponding to the above-described allocation in each of the display periods, of the first to n-th display periods.

This corresponds to FIG. 7, and, in the scanning line selection periods TS1, TS2, TS3, and TS4, the first, second, third, and fourth bits are set to the pixel circuit 30 in the bright environment, and the second, third, fourth, and first bits are set to the pixel circuit 30 in the dark environment. Then, in the bright environment, the control line driving circuit 130 activates the enable signal EN in all of the respective display periods TD1 to TD4, and in the dark environment, activates the enable signal EN in all of the respective display periods TD1 to TD3 and in 1/16 of the display period TD4.

According to the embodiment, the allocation of which of the bits, of the first to n-th bits, are set to the pixel circuit 30 in each of the scanning line selection periods is changed in accordance with the above-described ratio, and the enable signal EN is active in the period of the length set in accordance with the allocation. The ratio occupied by the on period in each of the display periods is not constant, but by changing the allocation and adjusting the period in which the enable signal EN s active, the length of the ON-state period TON in which the light emitting element 31 is ON-state is adjusted, and the display luminance is adjusted.

3. First Example of Scanning Line Selection Order

Above, the configuration and operations of the single pixel circuit are mainly described, but below, a method will be described for driving the pixel array 20 of k rows and m columns. Note that a plurality of examples described below can be implemented in combination with each other as appropriate.

Figure 8:
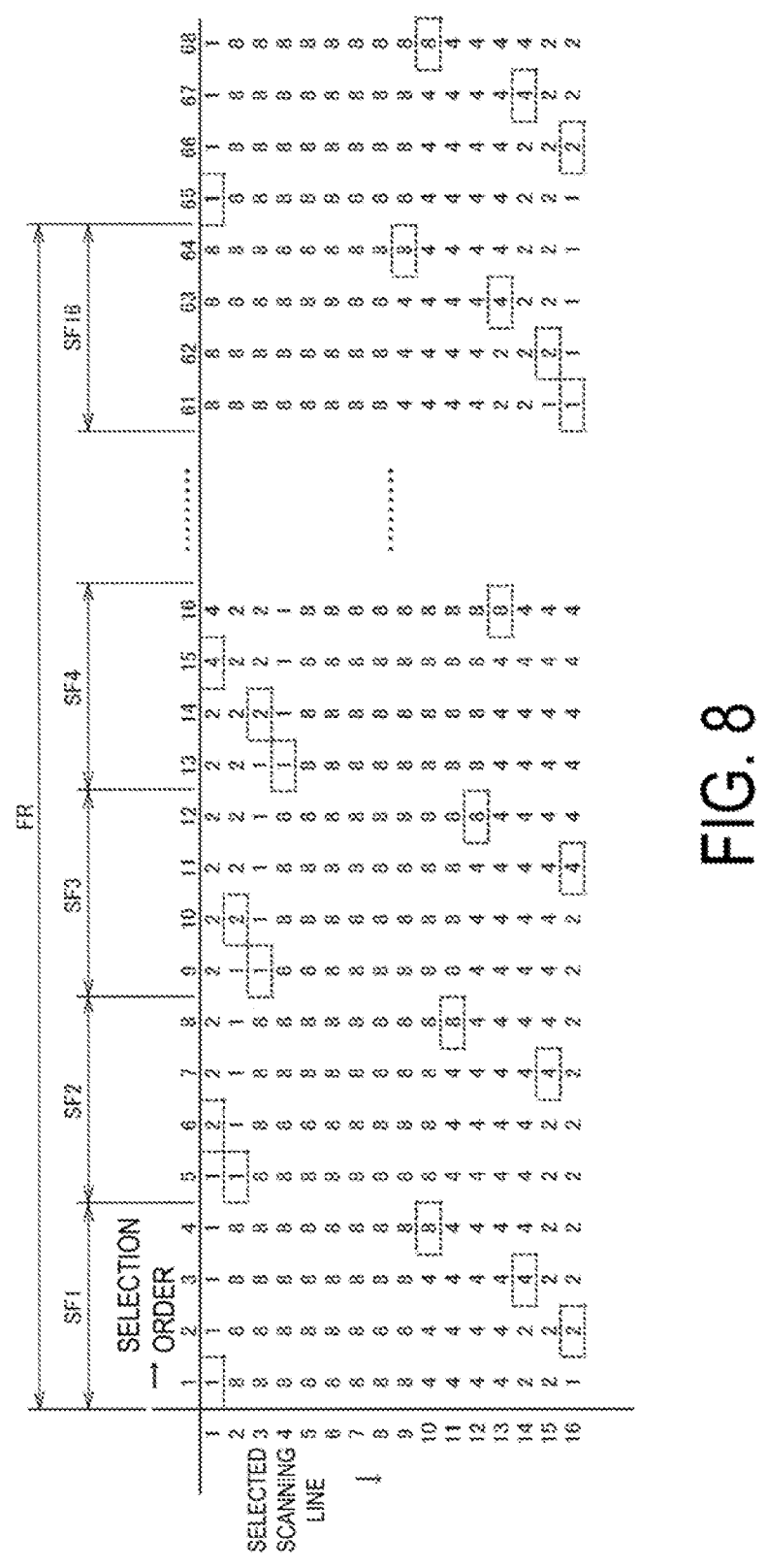
Figure 9:
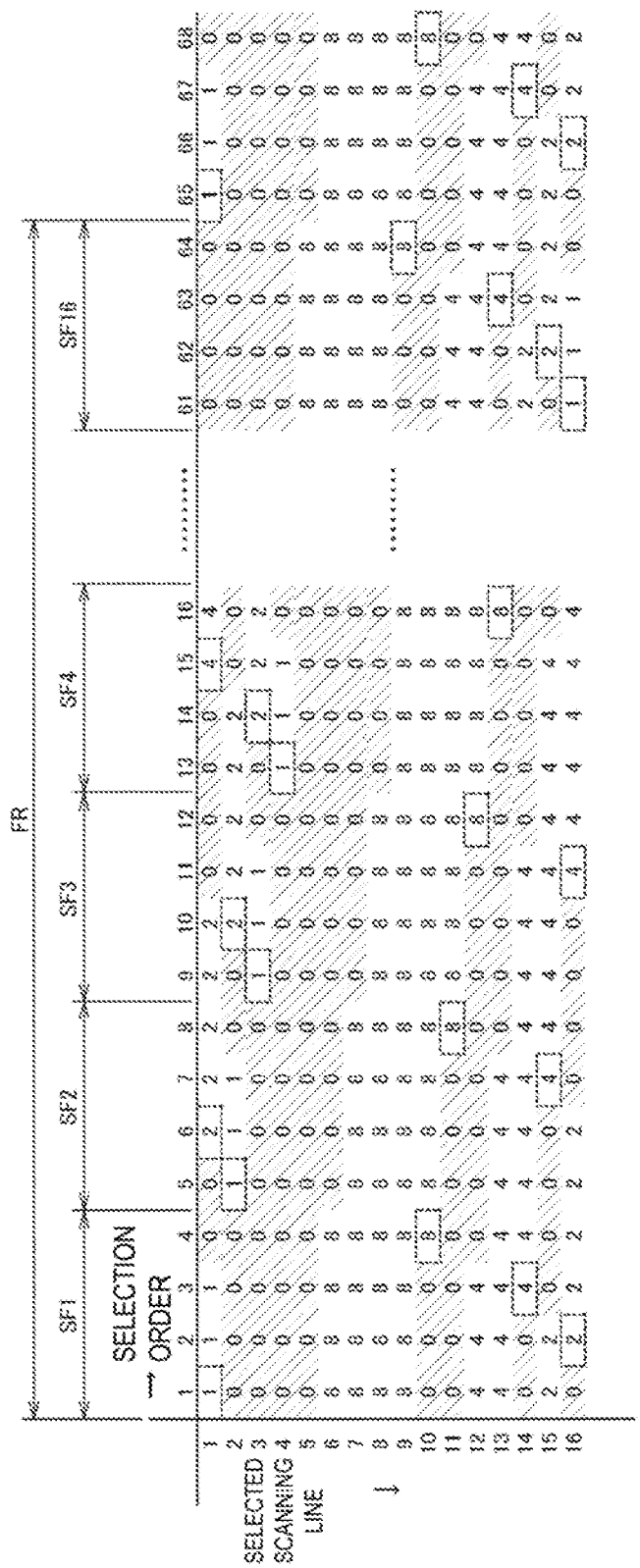
FIG. 9 is the first example of the scanning line selection order.

FIG. 8 and FIG. 9 are first examples of the scanning line selection order according to the embodiment. An example in the bright environment is illustrated in FIG. 8, and an example in the dark environment is illustrated in FIG. 9. Here, a case will be described in which a total number of the scanning lines included in the pixel array 20 is k=16, and a number of the bits of display data is n=4. The first to fourth bits are assumed to be from the LSB side of the display data. Note that, when the first to 16-th scanning lines are simply referred to, this indicates the pixel circuits in the first to 16-th rows in the pixel array. Then, the digital scanning lines and analog scanning lines that are electrically connected to the pixel circuits in the first to 16-th rows are referred to as the first to 16-th digital scanning lines and the first to 16-th analog scanning lines.

In FIG. 8, the horizontal axis of the table is the selection order, and one time in the selection order corresponds to the selection of one of the digital scanning lines. In other words, the one time in the selection order corresponds to one horizontal scanning period. The vertical axis of the table indicates the number of the scanning line, and these are in order of 1 to 16 in a vertical scanning direction. The number listed in each cell of the table indicates the grayscale value of each bit of the display data. In other words, 1, 2, 4, and 8 refer to the first bit, the second bit, the third bit, and the fourth bit. The cells surrounded by the dotted lines refer to the scanning line selection period in the digital driving. In other words, the number surrounded by the dotted lines means that the bit corresponding to that number is set to the pixel circuit electrically connected to the selected digital scanning line. The cells that are not surrounded by the dotted lines refer to the display period in the digital driving.

First, the first scanning line will be described as an example for the operations when focusing on one of the scanning lines. The digital driving is performed in a selection order 1 to 64. In the selection order 1, the first digital scanning line is selected, and the first bit is set to the digital driving circuit. In the subsequent selection order 2 to 5, the light emitting element is turned on or off based on the first bit held in the digital driving period. Similarly, the first digital scanning line is selected in the selection order 6, 15, and 32, and the second bit, the third bit, and the fourth bit are set to the digital driving circuit. In the subsequent selection order 7 to 14, 16 to 31, and 33 to 64, the light emitting element is turned on or off based on the second bit, the third bit, and the fourth bit held in the digital driving circuit.

In the above description, in the digital driving period in one field, the first to fourth scanning line selection periods and the first to fourth display periods are provided corresponding to the first to fourth bits. In the first scanning line, the first to fourth scanning line selection periods are periods corresponding to the selection order 1, 6, 15, and 32, and the first to fourth display periods are periods corresponding to the selection order 1 to 5, 7 to 14, 16 to 31, and 33 to 64. The lengths of the first to fourth display periods are 4 h, 8 h, 16 h, and 32 h. Whether any given selection order corresponds to the scanning line selection period or the display period differs depending on each of the scanning lines, but the first to fourth scanning line selection periods and the first to fourth display periods are the same in terms of being provided for each of the scanning lines.

Next, operations when scanning the 16 scanning lines will be described. FR is a field, and one frame is constituted by one field. In other words, the field FR is a period constituting one image, and is a period required for writing the display data corresponding to the one image to all of the pixels. Note that the same field FR is defined for all of the scanning lines based on the selection order in any one of the scanning lines. For example, in FIG. 8, the field FR is defined based on the selection order in the first scanning line. Thus, the image data set to the pixel array 20 in the field FR is not precisely the image data clearly delineated for the one image, but corresponds to one image in terms of the image data amount. In this sense, the field FR is the period constituting the one image.

The field FR includes subfields SF1 to SF16 corresponding to the 16 scanning lines. When the length of the scanning line selection period is h, the length of each of the subfields is 4 h corresponding to the four bits of the display data.

In each of the subfields, the scanning line driving circuit 110 selects a scanning line group that is a selection target among the first to 16-th digital scanning lines. In FIG. 8, the scanning line group is constituted by the four digital scanning lines that are the same as the four bits of the display data. Of those four digital scanning lines, the first bit is set to the pixel circuit electrically connected to one of the digital scanning lines, the second bit is set to the pixel circuit electrically connected to another of the digital scanning lines, the third bit is set to the pixel circuit electrically connected to yet another of the digital scanning lines, and the fourth bit is set to the pixel circuit of yet another of the digital scanning lines. For example, in the subfield SF1, the first digital scanning line, the 16-th digital scanning line, the 14-th digital scanning line, and the 10-th digital scanning line are the scanning line group, and the first bit, the second bit, the third bit, and the fourth bit are set to the pixel circuits respectively electrically connected to those scanning lines.

The four digital scanning lines belonging to the scanning line group are respectively selected in a different selection order. In the subfield SF1 illustrated in FIG. 8, the first digital scanning line, the 16-th digital scanning line, the 14-th digital scanning line, and the 10-th digital scanning line belonging to the scanning line group are respectively selected in the selection order 1, 2, 3, and 4.

When advancing by one subfield, the number of the digital scanning lines belonging to the scanning line group increases by one. In other words, a selection order pattern in the subfield moves by an amount corresponding to one scanning line in a downward direction of a screen. This pattern movement is performed in a cyclical manner. In other words, the selection order pattern of the 16-th scanning line in a given subfield is the selection order pattern of the first scanning line in the subsequent subfield. For example, in the subfield SF2, the second digital scanning line, the first digital scanning line, the 15-th digital scanning line, and the 11-th digital scanning line are the scanning line group, and the first bit, the second bit, the third bit, and the fourth bit are set to the pixel circuits respectively electrically connected to those scanning lines. This is because the selection order pattern in the subfield SF1 has moved downward by one scanning line in the cyclical manner.

In the subfield SF1, the first to fourth bits are set to the first scanning line, the 16-th scanning line, the 14-th scanning line, and the 10-th scanning line. In terms of spacing between the scanning lines, the first scanning line is one scanning line before the 16-th scanning line, the 14-th scanning line is two scanning lines before the 16-th scanning line, and the 10-th scanning line is four scanning lines before the 14-th scanning line. In the subsequent subfield SF2, the first bit is set to the second scanning line, and this is 8 scanning lines before the 10-th scanning line. In this way, the first to fourth display periods have lengths proportional to the grayscale values. Specifically, a description will be given when focusing on the display period in the first scanning line. First, the second bit is set to the 16-th scanning line in the selection order 2, and this selection order pattern moves to the first scanning line after one subfield. Since the length of the subfield is 4 h and the first display period of the first scanning line starts from the selection order 2, the length of the first display period is 1×4 h. Subsequently, the third bit is set to the 15-th scanning line in the selection order 7, and this selection order pattern moves to the first scanning line after two subfields. Since the second display period of the first scanning line starts from the selection order 7, the length of the second display period is 2×4 h=8 h. Similarly, the length of the third display period is 4×4 h. The length of the fourth display period is 8×4 h.

Since the total number of scanning lines is 16 and the writing of the four bits is required per scanning line, the total number of scanning line selections in one field is 16×4=64. In FIG. 8, one field is constituted by the selection order 1 to 64, and the same selection order pattern as that selection order pattern is repeated in the selection order 65 to 128 in the next field. The same selection order pattern is repeated in each field in the same manner, for the selection order of 129 and onward. Note that an exact formula for the total number of scanning line selections will be described later.

FIG. 8 illustrates the operations when the display luminance is maximized in the bright environment. In other words, the control line driving circuit 130 activates the enable signal EN for all of the first to fourth display periods corresponding to the grayscale values 1, 2, 4, and 8.

FIG. 9 illustrates the operations when the display luminance in the dark environment is caused to be ½ the display luminance in the bright environment. The operations of the digital driving are the same as in FIG. 8, except for the active periods of the enable signal EN. In FIG. 9, the light emission being turned off by the enable signal EN is indicated by hatching and "0". In other words, the control line driving circuit 130 activates the enable signal EN in the first half of each of the first to fourth display periods, and deactivates the enable signal EN in the second half thereof. FIG. 9 is a combination of the digital driving illustrated in FIG. 8 and the operations of the pixel circuit 30 in the dark environment illustrated in FIG. 6. Note that the active period of the enable signal EN is not limited to the first half of each of the display periods, and it is sufficient that the active period be ½ of each of the display periods. For example, the active period of the enable signal EN may be provided in the center or latter half of each of the display periods, or a plurality of active periods may be provided within each of the display periods.

In the embodiment described above, the field FR includes the plurality of subfields SF1 to SF16. In the subfields included in the plurality of subfields SF1 to SF16, the scanning line driving circuit 110 selects the one scanning line group that is the selection target, from among the plurality of digital scanning lines LDSC1 to LDSCk. The scanning line group includes the digital scanning line electrically connected to the pixel circuit 30 to which an i-th bit is set in the subfield, and the digital scanning line electrically connected to the pixel circuit 30 to which a j-th bit is set in the subfield. i is an integer equal to or greater than 1 and equal to or less than n, and j is an integer equal to or greater than 1 and equal to or less than n, and is different to i.

For example, when i=1 and j=2, in the subfield SF1 in FIG. 8, the first bit is set to the first scanning line, and the second bit is set to the 16-th scanning line. In other words, in the subfield SF1, the scanning line group includes the first scanning line and the 16-th scanning line.

In JP-A-2019-132941 and JP-A-2008-281827 described above, while selecting a plurality of scanning lines one by one in descending order, a given bit is set to a pixel electrically connected to each of the selected scanning lines. Following this, up to when the writing of a next bit is started, a period occurs in which the scanning line is not selected. Since the length of one frame is determined by the frame rate, there is an issue in that the scanning line drive frequency increases as a result of the period being present in which the scanning line is not selected. According to the embodiment, the i-th bit is set to the one scanning line in the one subfield, and the j-th bit is set to another of the scanning lines. In this way, a non-scanning period in which the scanning line is not selected can be reduced, and the scanning line drive frequency can be decreased compared to the known method. As a result of the scanning line drive frequency decreasing, it is possible to reduce power consumption in the scanning line driving, or to write the data to the pixel circuit in a reliable manner. Alternatively, when considered from the point of view of the scanning line drive frequency being the same as that of the known method, in the one frame, more of the scanning lines can be selected. In other words, a higher definition electro-optical device can be driven without increasing the scanning line drive frequency compared to the known method.

Here, the plurality of subfields SF1 to SF16 are the subfields included in the field FR, and specifically, the plurality of subfields are obtained by dividing the field FR into the plurality of periods. Further, the plurality of digital scanning lines are the digital scanning lines for constituting the scanning line selection order pattern, and the number of the digital scanning lines is not limited to the number of scanning lines actually present in the electro-optical device. In FIG. 8, the scanning line selection order pattern is constituted by the 16 scanning lines. At this time, the number of scanning lines actually present in the electro-optical device may be 16, or may be less than 16. For example, when the number of scanning lines actually present in the electro-optical device is 14, the selection order pattern of the first to 16-th scanning lines is present as internal processing of the circuit device 100, but the 15-th to 16-th scanning lines are not actually driven. Further, selecting the scanning line group in the sub-field one time means that, in the sub-field, each of the digital scanning lines belonging to the scanning line group is selected one time. At this time, the one digital scanning line is selected in the same selection order, and two or more of the digital scanning lines are not selected at the same time.

Further, in the embodiment, each of the subfields of the plurality of subfields SF1 to SF16 is a period of the same length. In the subfield, the scanning line driving circuit 110 selects, as the scanning line group, the n digital scanning lines, from the digital scanning line electrically connected to the pixel circuit 30 to which the first bit is to be set to the digital scanning line electrically connected to the pixel circuit 30 to which the n-th bit is to be set. In that subfield, the scanning line driving circuit 110 selects the analog scanning line of the pixel circuit 30 electrically connected to the digital scanning line different from the n digital scanning lines described above.

For example, in the subfield SF1 illustrated in FIG. 8, the first bit, the second bit, the third bit, and the fourth bit are set to the first scanning line, the 16-th scanning line, the 14-th scanning line, and the 10-th scanning line. In other words, in the subfield SF1, the scanning line group is the first scanning line, the 16-th scanning line, the 14-th scanning line, and the 10-th scanning line, and includes the four scanning lines.

Each of the subfields being the period of the same length means that the number of scanning lines of the selected scanning line group is the same in each of the subfields. Then, the same number of scanning lines as the number of bits of the display data are selected while being shifted for each of the subfields until one cycle is completed. As a result, the first to n-th bits are set into all of the scanning lines in the one frame. In FIG. 8, the four scanning lines are selected in each of the subfields, the pattern thereof is shifted by one scanning line for each of the subfields, and the one cycle is completed by the 16 subfields. In this way, the first to fourth bits are set to the 16 scanning lines in the one frame.

Further, in the embodiment, in the field FR, of the plurality of digital scanning lines LDSC1 to LDSCk, the scanning line driving circuit 110 selects each of the scanning lines n times each, and thus, the first to n-th bits of display data are set to each of the pixel circuits.

Specifically, when the scanning line driving circuit 110 selects the digital scanning line n times, in the selection each time, the digital signal line driving circuit 120 writes one bit of the first to n-th bits to the pixel circuit electrically connected to the selected digital scanning line. At this time, in the n number of selections, the digital signal line driving circuit 120 writes the first to n-th bits so that the first to n-th bits do not overlap with each other. In FIG. 8, for example, the first scanning line is selected four times in the selection order 1, 6, 15, and 32, and the first, second, third, and fourth bits are set to the first scanning line, respectively.

As described above, when focusing on the one scanning line, the first to n-th scanning line selection periods and the first to n-th display periods are necessary in the one field. According to the embodiment, each of the scanning lines is selected n times, and the first to n-th bits are set to those scanning lines. In this way, in the one field, the first to n-th scanning line selection periods and the first to n-th display periods are realized for all of the scanning lines.

4. Second Example of Scanning Line Selection Order

Figure 10:
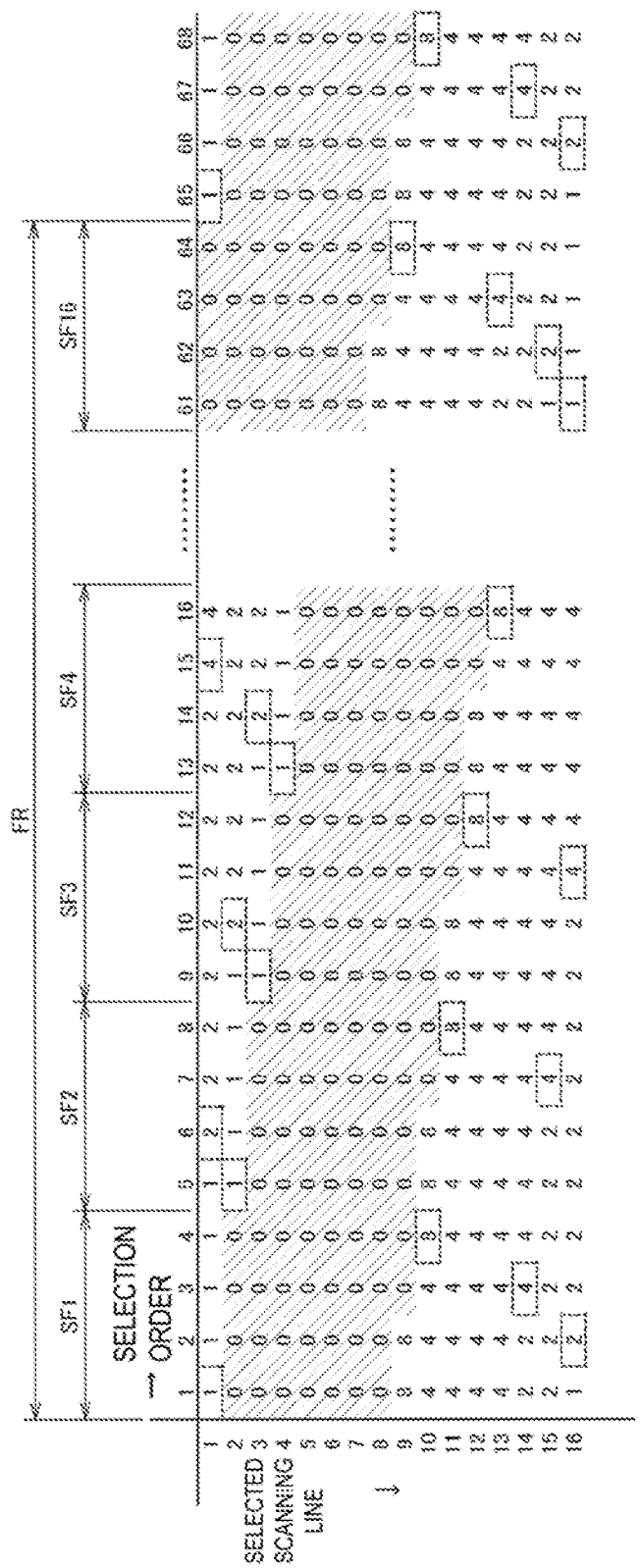
FIG. 10 is a second example of the scanning line selection order.

FIG. 10 is a second example of the scanning line selection order according to the embodiment. The operations in the bright environment are the same as illustrated in FIG. 8, and FIG. 10 illustrates the operations when the display luminance in the dark environment is caused to be ½ the display luminance in the bright environment. This example is a combination of the digital driving illustrated in FIG. 8 and the operations of the pixel circuit 30 in the dark environment illustrated in FIG. 7.

The length of the first display period corresponding to the grayscale value 1 of the first bit is 1×4 h. In all of these first display periods, the control line driving circuit 130 activates the enable signal EN. Similarly, the lengths of the second and third display periods corresponding to the grayscale values 2 and 4 are 2×4 h and 4×4 h. In all of the second and third display periods, the control line driving circuit 130 activates the enable signal EN.

The length of the fourth display period corresponding to the grayscale value 8 is 8×4 h. In ⅟₁₆ of this fourth display period, the control line driving circuit 130 activates the enable signal EN. In other words, of the fourth display period of 8×4 h=32 h, the enable signal EN is active for 2 h, and the enable signal EN is inactive for 30 h.

5. Third Example of Scanning Line Selection Order

Figure 11:
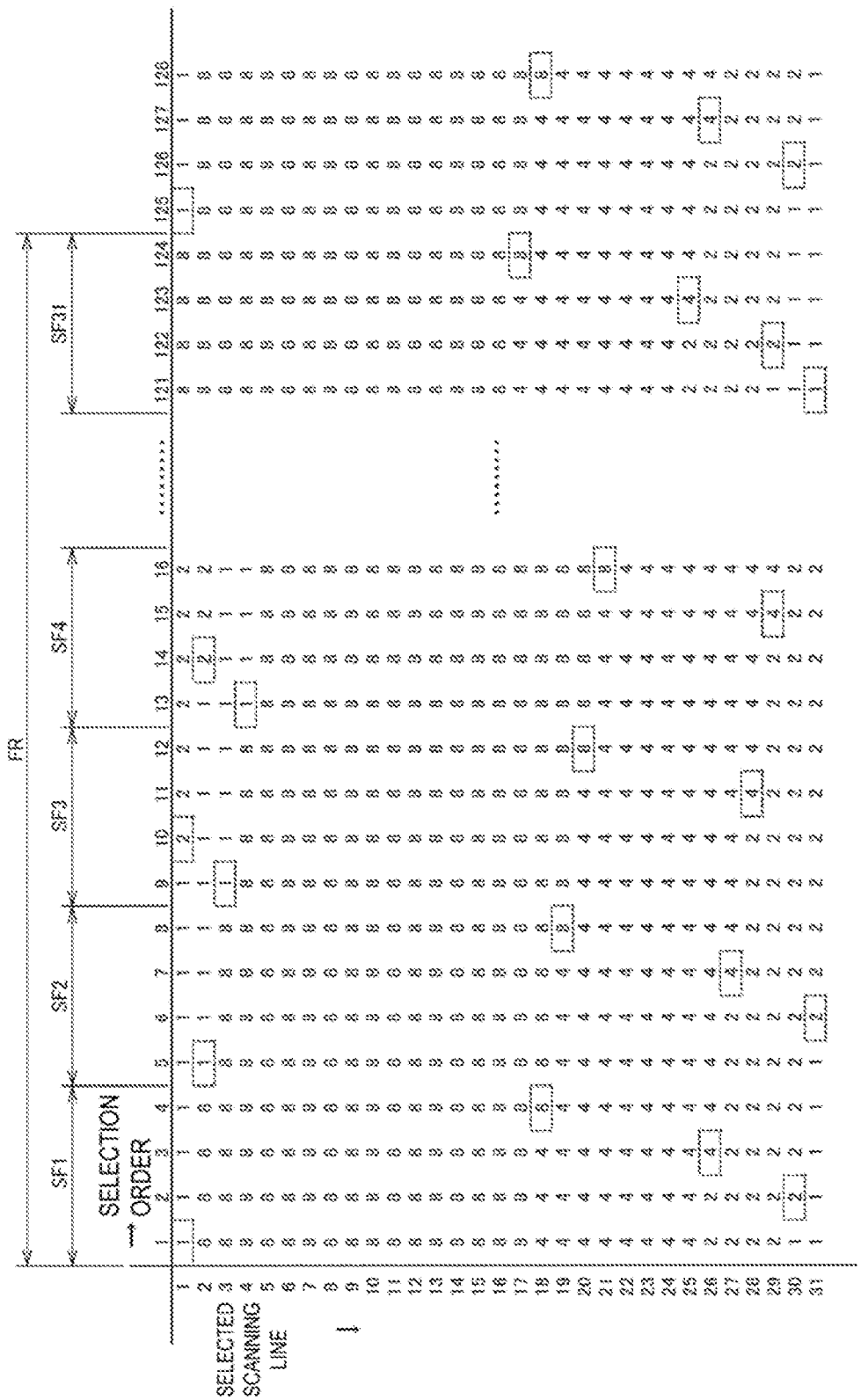
FIG. 11 is a third example of the scanning line selection order.

FIG. 11 is a third example of the scanning line selection order according to the embodiment. In the first example, the display period of the first bit in the digital driving is 4 h, which corresponds to the one subfield, but in the third example, the display period of the first bit in the digital driving is 2×4 h, which corresponds to two of the subfields. Although FIG. 11 illustrates the operations in the dark environment, these can be combined with the operations in the dark environment illustrated in FIG. 6 or FIG. 7. Further, analog current setting to be described below can also be combined therewith.

In the third example, the number of scanning lines is 31, and the total number of scanning line selections in the field FR is 31×4 bits=124 times. Hereinafter, where the total number of scanning line selections is Nfr, a formula for determining Nfr will be described.

A number obtained by dividing the length of the display period of the first bit by the length of the subfield is defined as a multiple a. a is an integer equal to or greater than 1. In the first and second examples, a=1, and in the third example, a=2. A period other than the digital driving period in one frame is a non-digital driving period. For example, when the analog current setting to be described below is performed, a current setting period for performing that analog current setting is a non-digital driving period. A number obtained by dividing the length of the non-digital driving period of the first bit by the length of the subfield is defined as b. In the first to third examples, b=0. The number of bits of the display data is defined as n. In the first to third examples, n=4. At this time, Formula (1) below is established.

$$Nfr=((2^n-1)\times a+1)\times n+b\times n \quad (1)$$

Further, the number k of the scanning lines is obtained by Formula (2) below.

$$k=Nfr/n=((2^n-1)\times a+1)+b \quad (2)$$

When n=4, a=2, and b=0 in the third example are inserted, Nfr=(($2^4$−1)×2+1)×4+0×4=124, and k=124/4=31 are obtained, which are consistent with FIG. 11. Further, in the first and second examples, Nfr=(($2^4$−1)×1+1)×4+0×4=64, and k=68/4=17 are obtained, which are consistent with FIG. 8 to FIG. 10.

According to the embodiment, in the range in which the number k of the scanning lines can be an integer, the number of bits n of the display data, and the multiple a indicating the length of the display period of the first bit can be freely adjusted. In this way, the embodiment can be applied to the display panels having the varying numbers of pixels. Further, when the current setting period is provided, since a variable b is variable, the length of the current setting period can be freely adjusted, and even in a high definition display panel or the like, a write time of the analog data voltage can be sufficiently secured.

6. Second Configuration Example of Electro-Optical Device and Display System

Below, an example will be described in which the display luminance is adjusted by performing the analog current setting that adjusts the drive current of the light emitting element 31, and performing the digital driving using the adjusted drive current. By combining the display luminance adjustment by this analog current setting with the above-described display luminance adjustment by the enable signal EN, an adjustment width of the display luminance is further extended.

Figure 12:
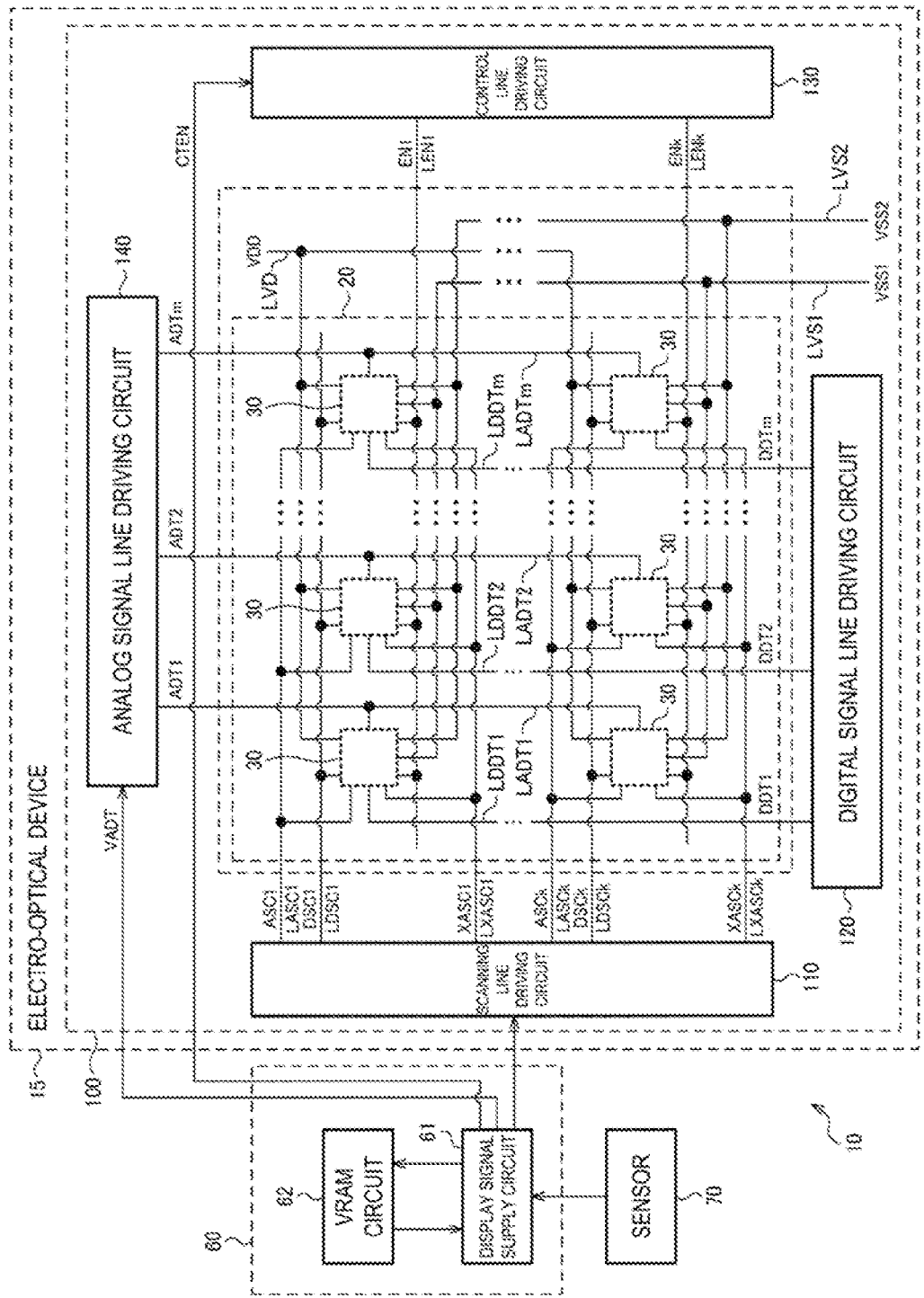
FIG. 12 is a second configuration example of the electro-optical device and the display system.

FIG. 12 is a second configuration example of the electro-optical device 15 and the display system 10 according to the embodiment. Hereinafter, differences from the first configuration example will be mainly described, and a description of portions that are the same as those of the first configuration example will be omitted as appropriate.

The display signal supply circuit 61 outputs the analog data voltage VADT to the circuit device 100 based on the luminance information of the environment. The display signal supply circuit 61 controls the analog data voltage VADT so as to reduce a current value of the drive current as the luminance of the environment becomes lower. Note that although an example is described in which the display signal supply circuit 61 outputs the analog data voltage VADT, a voltage generation circuit or the like incorporated in an electronic apparatus in which the electro-optical device 15 is installed may output the analog data voltage VADT.

The circuit device 100 of the electro-optical device 15 further includes an analog signal line driving circuit 140. The pixel array 20 further includes analog scanning lines LASC1 to LASCk, analog inversion scanning lines LXASC1 to LXASCk, and analog signal lines LADT1 to LADTm.

The analog scanning line LASC1 and the analog inversion scanning line LXASC1 are electrically connected to the pixel circuits 30 in the first row. The scanning line driving circuit 110 outputs an analog selection signal ASC1 to the analog scanning line LASC1 and outputs an analog inversion selection signal XASC1, which is a logical inversion signal of the analog selection signal ASC1, to the analog inversion scanning line LXASC1. Similarly, the analog scanning lines LASC2 to LASCk and the analog inversion scanning lines LXASC2 to LXASCk are electrically connected to the pixel circuits 30 in the second to k-th rows. The scanning line driving circuit 110 outputs analog selection signals ASC2 to ASCk to the analog scanning lines LASC2 to LASCk and outputs analog inversion selection signals XASC2 to XASCk, which are logical inversion signals of the analog selection signals ASC2 to ASCk, to the analog inversion scanning lines LXASC2 to LXASCk.

The analog signal line LADT1 is electrically connected to the pixel circuits 30 in the first column. The analog signal line driving circuit 140 generates a threshold-compensated analog data voltage ADT1 from the analog data voltage VADT, and outputs the analog data voltage ADT1 to the analog signal line LADT1. Similarly, the analog signal lines LADT2 to LADTm are electrically connected to the pixel circuits 30 in the second to m-th columns. The analog signal line driving circuit 140 generates threshold-compensated analog data voltages ADT2 to ADTm from the analog data voltage VADT, and outputs the analog data voltages ADT2 to ADTm to the analog signal lines LADT2 to LADTm.

Here, the threshold compensation is to compensate for variations in the drive current by compensating for threshold variation in a transistor that generates the drive current of the light emitting device. The analog driving circuit 35 stores k×m compensation values corresponding to the k rows and m columns of the pixel circuits 30, and generates the analog data voltages ADT1 to ADTm by compensating for the analog data voltage VADT using the m compensation values corresponding to the m pixel circuits 30 electrically connected to the selected analog scanning lines.

Note that in FIG. 12, an example is described in which the analog signal line driving circuit 140 performs the threshold compensation, but the pixel circuit 30 may perform the threshold compensation. In this case, the analog signal line driving circuit 140 may be omitted, and the analog data voltage VADT from the display signal supply circuit 61 may be commonly input to all of the pixel circuits 30.

Figure 13:
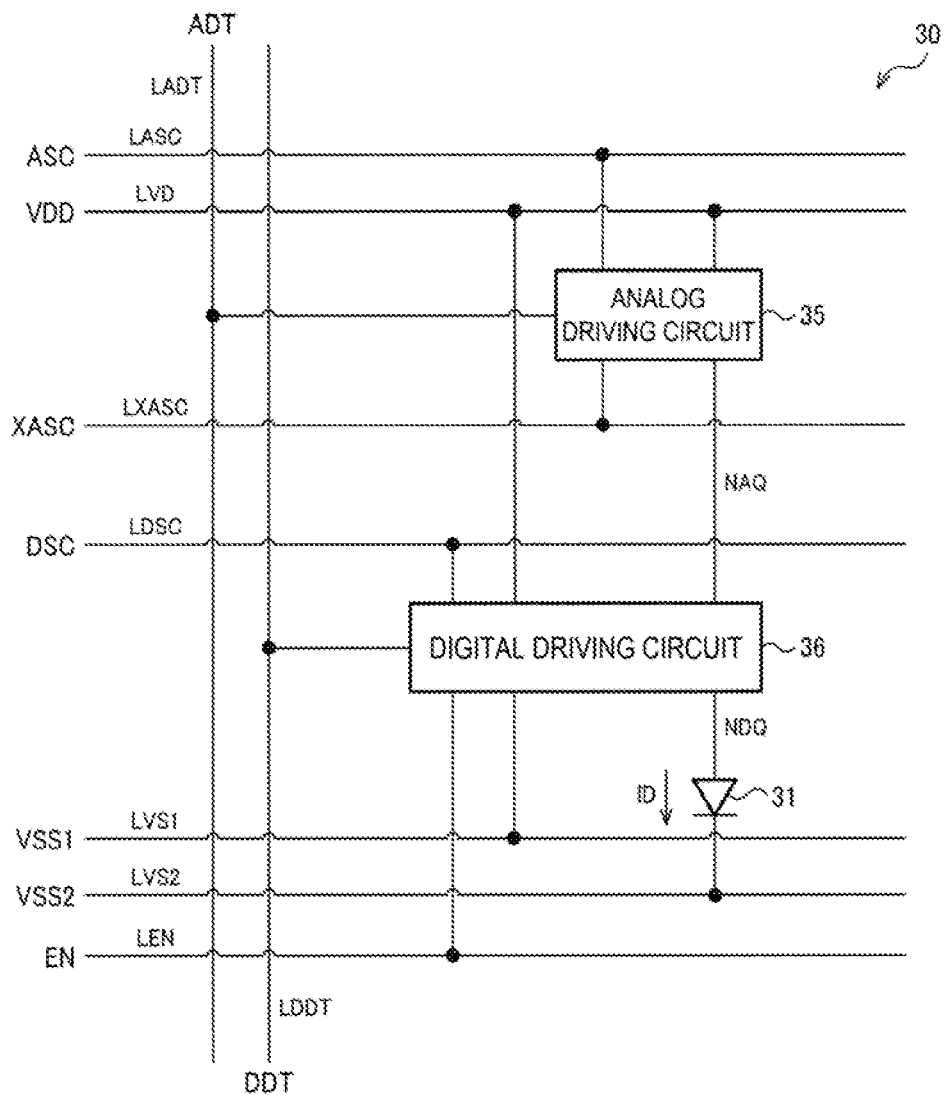
FIG. 13 is a second configuration example of the pixel circuit.

FIG. 13 is a second configuration example of the pixel circuit 30. The pixel circuit 30 further includes the analog driving circuit 35. Note that in FIG. 13, in relation to ASC1 to ASCk, ADT1 to ADTm, and the like, 1 to k and 1 to m are omitted. For example, ASC refers any one of ASC1 to ASCk.

Hereinafter, an example is described in which the analog driving circuit 35, the digital driving circuit 36, and the light emitting element 31 are electrically connected side by side in that order, from the power source to the ground. However, the light emitting element 31, the digital driving circuit 36, and the analog driving circuit 35 may be electrically connected side by side in that order, from the power source to the ground.

The analog driving circuit 35 captures the analog data voltage ADT when the analog scanning line LASC and the analog inversion scanning line LXASC are selected and holds that analog data voltage ADT. The analog driving circuit 35 causes the drive current of a current value specified by the held analog data voltage ADT to flow from the power source line LVD to a node NAQ. In the following description, an operation of setting this drive current is referred to as analog current setting.

The digital driving circuit 36 causes the drive current adjusted by the analog driving circuit 35 to flow from the node NAQ to the node NDQ when the digital data signal DDT stored in the storage circuit 33 is active and the enable signal EN is active. Note that in the following description, it is assumed that an active bit is "0" or low level, and an inactive bit is "1" or high level. The configuration example of the digital driving circuit 36 is the same as that illustrated in FIG. 5.

Figure 14:
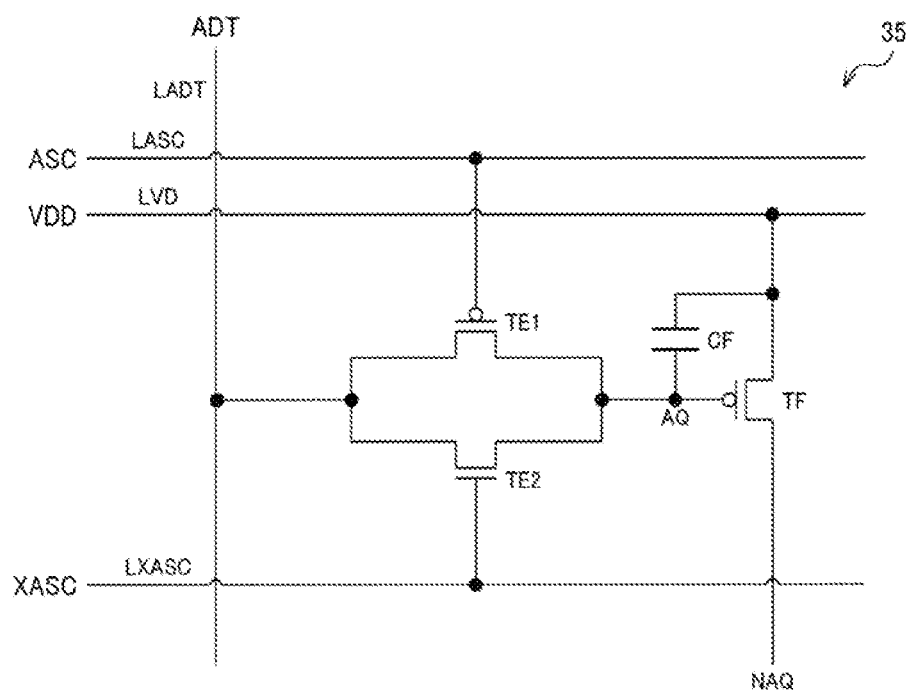
FIG. 14 is a configuration example of an analog driving circuit.

FIG. 14 is a configuration example of the analog driving circuit 35. The analog driving circuit 35 includes P-type transistors TE1 and TF, an N-type transistor TE2, and a capacitor CF. Note that the configuration of the analog driving circuit 35 is not limited to FIG. 14, and a configuration may be adopted in which the threshold compensation is performed in the analog driving circuit 35. In this case, the analog signal line driving circuit 140 described above may be omitted.

The P-type transistor TE1 and the N-type transistor TE2 are switch circuits provided between the analog signal line LADT and one end of the capacitor CF. Specifically, one of the source or drain of the P-type transistor TE1 and the N-type transistor TE2 is electrically connected to the analog signal line LADT, and the other is electrically connected to the gate of the P-type transistor TF. The gate of the P-type transistor TE1 is electrically connected to the analog scanning line LASC, and the gate of the N-type transistor TE2 is electrically connected to the analog inversion scanning line LXASC. The source of the P-type transistor TF is electrically connected to the power source line LVD, and the drain is electrically connected to the node NAQ. One end of the capacitor CF is electrically connected to the gate of the P-type transistor TF, and the other end is electrically connected to the source of the P-type transistor TF.

The capacitor CF holds the analog data voltage ADT input from the analog signal line LADT. The P-type transistor TF is a current supply transistor, and supplies, to the digital driving circuit 36, a drive current corresponding to the analog data voltage ADT held in the capacitor CF.

Figure 15:
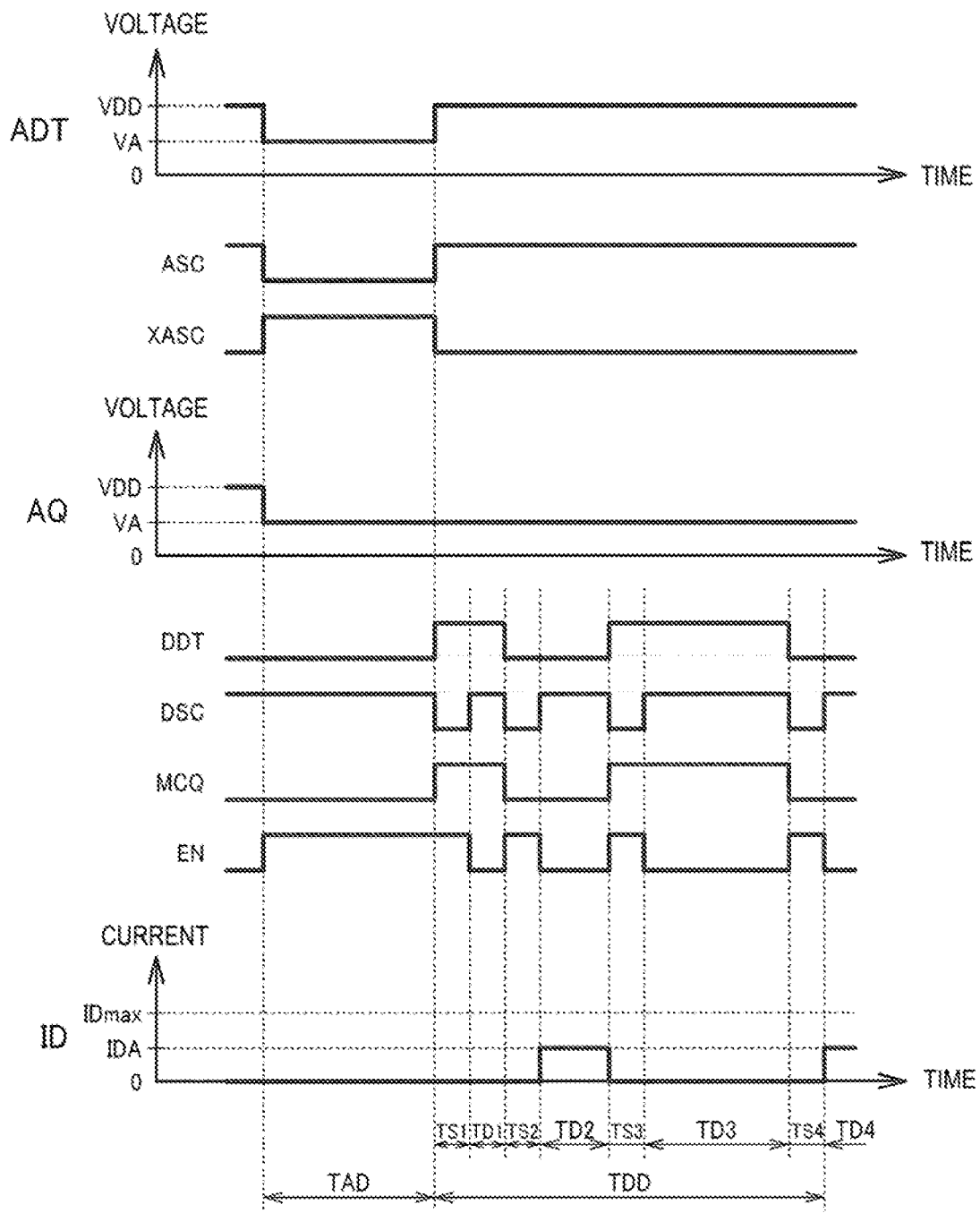
FIG. 15 is a diagram illustrating operations of the second configuration example of the pixel circuit.

FIG. 15 is a diagram illustrating operations of the second configuration example of the pixel circuit 30. In FIG. 8, an example is illustrated in which the current value of the drive current ID is set to IDA<IDmax.

One frame includes a current setting period TAD during which the analog current setting is performed and a digital driving period TDD during which the digital driving is performed using the drive current set by the analog current setting.

In the current setting period TAD, the analog driving circuit 35 outputs an analog data voltage ADT=VA corresponding to a current value IDA. Further, the scanning line driving circuit 110 outputs the low level analog selection signal ASC and the high level analog inversion selection signal XASC. At this time, the P-type transistor TE1 and the N-type transistor TE2 of the analog driving circuit 35 are ON-state, and a voltage AQ at one end of the capacitor CF becomes the analog data voltage ADT=VA. At the end of the current setting period TAD, the scanning line driving circuit 110 sets the analog selection signal ASC to the high level and the analog inversion selection signal XASC to the low level. At this time, the P-type transistor TE1 and the N-type transistor TE2 are turned off, and the voltage AQ=VA is held at the one end of the capacitor CF. In the current setting period TAD, the control line driving circuit 130 outputs the high level enable signal EN. In this way, the P-type transistor TB2 is OFF-state, and the light emitting element 31 is thus turned off.

In the digital driving period TDD subsequent to the current setting period TAD, the digital driving circuit 36 performs the digital driving. The operations of the digital driving are the same as those illustrated in FIG. 6 or FIG. 7. In the display periods TD2 and TD4, the light emitting element 31 is ON-state, and the drive current ID=IDA flows to the light emitting element 31. This drive current ID=IDA is a current value adjusted by the analog voltage setting, and the light emission luminance when the light emitting element 31 is ON-state is adjusted. In this way, even when the grayscale value of the digital driving is the same, the display luminance is adjusted by the current value of the drive current.

Although the operations in the bright environment are illustrated in FIG. 15, as described with reference to FIG. 6 or FIG. 7, in the dark environment, the display luminance is adjusted by adjusting the ratio of the active period of the enable signal EN in each of the display periods. In this way, the display luminance adjustment by the analog current setting and the display luminance adjustment by the enable signal EN are combined, and the adjustment width of the display luminance is further expanded in comparison to the display luminance adjustment by the enable signal EN only.

7. Fourth Example of Scanning Line Selection Order

Figure 16:
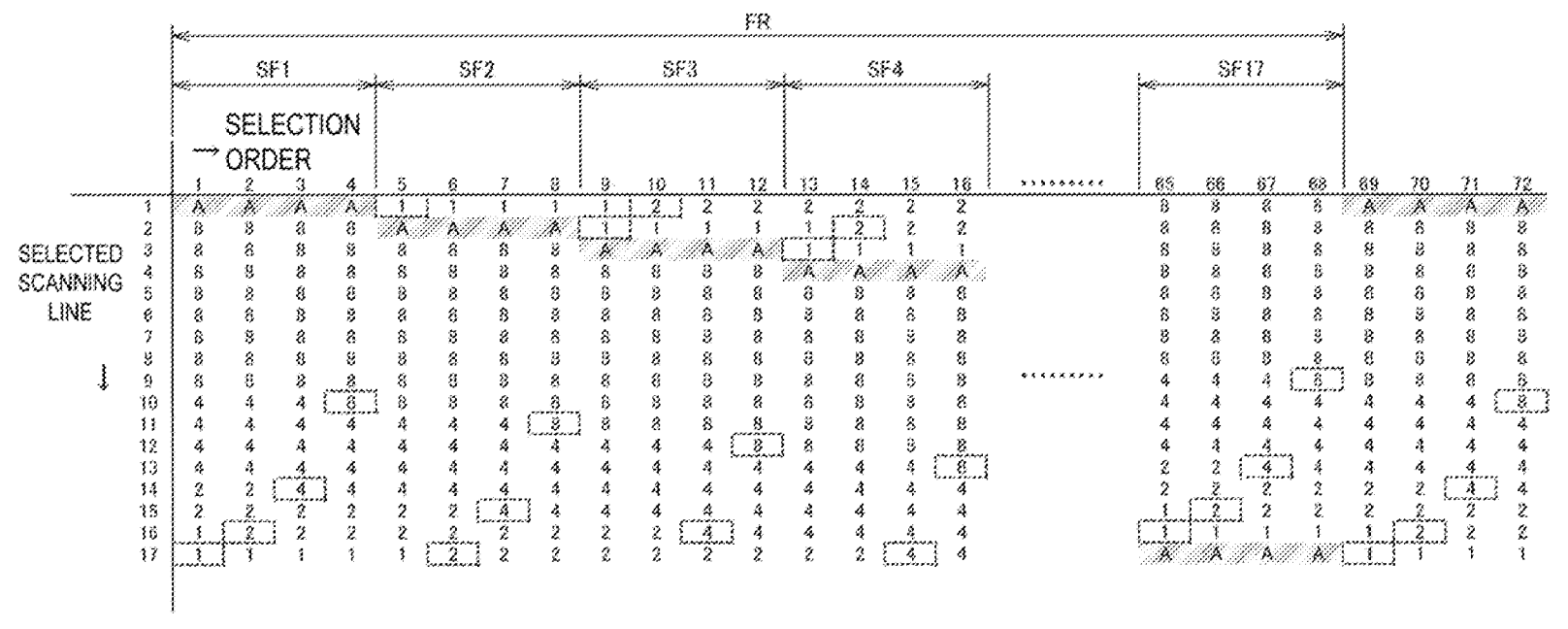
Figure 17:
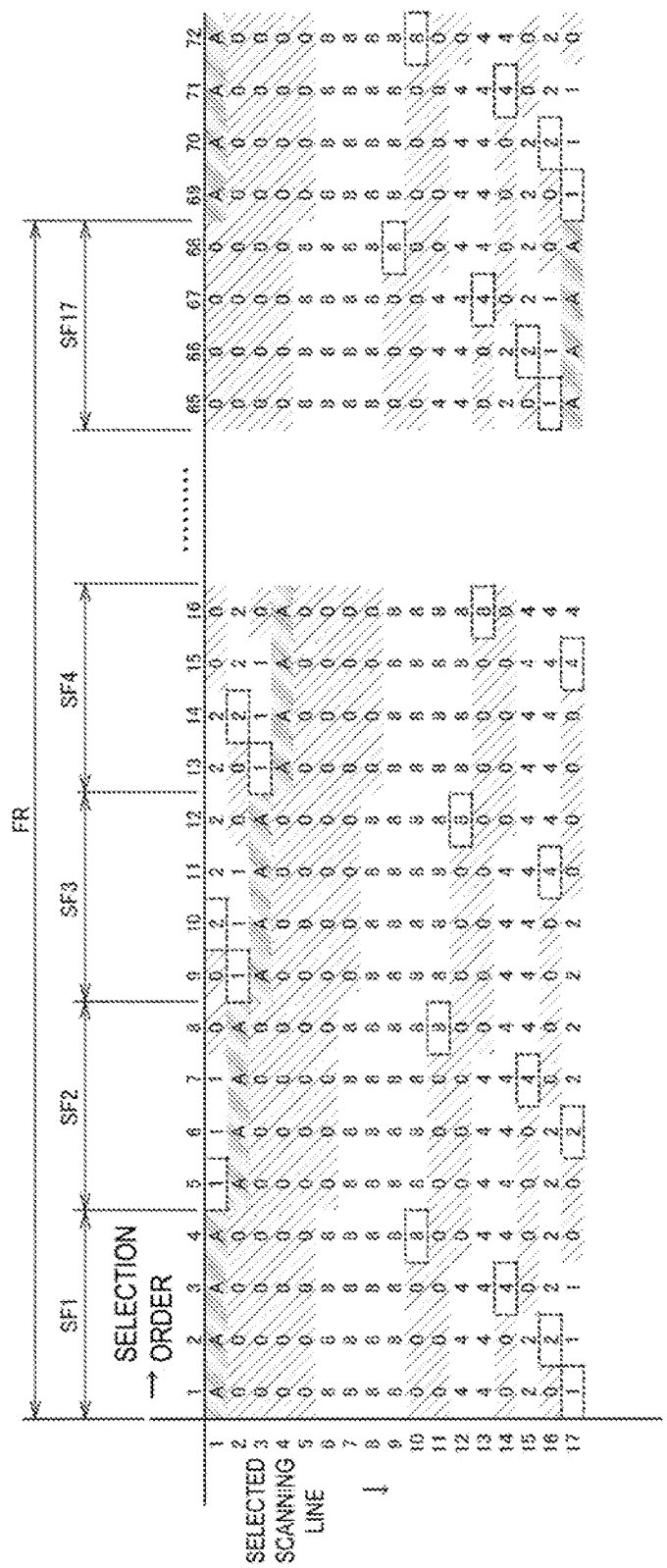
FIG. 17 is the fourth example of the scanning line selection order.

FIG. 16 and FIG. 17 are a fourth example of the scanning line selection order according to the embodiment, and are an example of the scanning line selection order when the analog current setting is combined. The example in the bright environment is illustrated in FIG. 16, and the example in the dark environment is illustrated in FIG. 17. Here, a case will be described in which a total number of the scanning lines included in the pixel array 20 is k=17, and a number of bits of the display data is n=4.

In FIG. 16 and FIG. 17, the cells that are hatched and denoted by A refer to the current setting periods in which the analog current setting is performed. Further, in FIG. 17, the cells that are hatched and denoted by O refer to the periods in which the enable signal EN is inactive, in the same manner as FIG. 9 and the like.

First, the first scanning line will be described as an example for the operations when focusing on one scanning line. The analog driving circuit of the first scanning line performs the analog current setting in the selection order 1 to 4. Note that the length of the selection order 1 to 4, which is the current setting period, is equivalent to the length of one of the subfields to be described below. The analog driving circuit of the first scanning line performs the digital driving in the subsequent selection order 5 to 68. The operations in the digital driving are the same as illustrated in FIG. 8, but the selection order is offset by an amount equivalent to the current setting period.

Next, operations when scanning the 17 scanning lines will be described. The field FR includes subfields SF1 to SF17 corresponding to the 17 scanning lines. The scanning line driving circuit 110 selects one of the analog scanning lines in each of the subfields, and the pixel circuit electrically connected to the selected analog scanning line performs the analog current setting. In one selection order, only one of the scanning lines performs the analog current setting. However, when the threshold compensation is performed, a plurality of the scanning lines may perform the analog current setting in one selection order.

Since the analog current setting and the digital driving can be performed independently, in one selection order, it is possible for the given scanning line to perform the analog current setting and for the other scanning lines to perform the digital driving. In each of the subfields, the scanning line driving circuit 110 selects a scanning line group that is a selection target among the first to 17-th digital scanning lines. For example, in the subfield SF1, the 17-th digital scanning line, the 16-th digital scanning line, the 14-th digital scanning line, and the 10-th digital scanning line are the scanning line group, and the first bit, the second bit, the third bit, and the fourth bit are set to the pixel circuits electrically connected to those scanning lines. In a similar manner to FIG. 8, the selection order pattern is shifted downward by one scanning line in the cyclical manner each time the subfield advances by one.

In the fourth example, the number of bits n=4, the multiple a=1, and the variable b=1 indicates the length of the non-digital driving period. Substituting these into Formula (1) and Formula (2), the total number of scanning line selections per frame is Nfr=$((2^4-1)\times1+1)\times4+1\times4=68$, and the number of scanning lines is k=68/4=17.

FIG. 16 illustrates the operations when the display luminance is maximized in the bright environment. In other words, the control line driving circuit 130 activates the enable signal EN for all of the first to fourth display periods corresponding to the grayscale values 1, 2, 4, and 8.

FIG. 17 illustrates the operations when the display luminance in the dark environment is caused to be ½ the display luminance in the bright environment. The control line driving circuit 130 activates the enable signal EN in the first half of each of the first to fourth display periods, and deactivates the enable signal EN in the second half thereof. Note that the example has been described in which the digital driving in the dark environment illustrated in FIG. 16 and FIG. 6 is combined. However, the digital driving in the dark environment illustrated in FIG. 16 and FIG. 7 may be combined.

In the embodiment described above, the electro-optical device 15 includes the plurality of analog scanning lines LASC1 to LASCk and the analog signal line LADT. The analog signal line LADT is any one of LADT1 to LADTm. Each of the pixel circuits 30 is electrically connected to the analog scanning line LASC included in the plurality of analog scanning lines LASC1 to LASCk and the analog signal line LADT. The analog scanning line LASC is any one of LASC1 to LASCk.

The pixel circuit 30 includes the analog driving circuit 35. When selected by the analog scanning line LASC, the analog data voltage ADT from the analog signal line LADT is set to the analog driving circuit 35, which variably sets the current value of the drive current ID based on the analog data voltage ADT. This is referred to as the analog current setting. The digital driving circuit 36 supplies the drive current ID from the analog driving circuit 35 to the light emitting element 31 in the on period TON described above.

According to the embodiment, the analog driving circuit 35 variably adjusts the drive current ID, and the digital driving circuit 36 performs the digital driving of the light emitting element 31 using that drive current ID. As a result, the light emission luminance when the light emitting element 31 is on is adjusted. In this way, as well as adjusting the display luminance using the enable signal EN, the display luminance adjustment can be performed by the analog current setting, and thus the adjustment width of the display luminance is further increased, in comparison to when the adjustment of the display luminance is performed using only the enable signal EN. For example, even if it is assumed that the light emission luminance in the dark environment is one several hundredths of the light emission luminance in the bright environment using only the display luminance adjustment by the analog current setting, since the drive current of approximately one gradation in the known analog driving described with reference to FIG. 1 is secured, the light emitting element 31 can emit the light in a stable manner. Then, by further combining the display luminance adjustment by the enable signal EN, the adjustment of the display luminance can be expanded while securing the light emission of the light emitting element 31 in the stable manner.

Further, in the embodiment, of the plurality of pixel circuits 30, the pixel circuit 30 electrically connected to the s-th digital scanning line LDSCs and the s-th analog scanning line LASCs is an s-th pixel circuit. Of the plurality of pixel circuits 30, the pixel circuit 30 electrically connected to the t-th digital scanning line LDSCt and the t-th analog scanning line LASCt, is the t-th pixel circuit. s and t are integers equal to or greater than 1. In a period in which the s-th pixel circuit performs the analog current setting, the t-pixel circuit performs the digital driving.

For example, in FIG. 16, when s=1, the pixel circuits of the first scanning line perform the analog current setting in the selection order 1 to 4, and the pixel circuits of the second to 17th scanning lines perform the digital driving. t may be any one of 2 to 17.

According to the embodiment, the analog scanning line LASC and the analog signal line LADT are provided with respect to the analog driving circuit 35, and the digital scanning line LDSC and the digital signal line LDDT are provided with respect to the digital driving circuit 36. In this way, it is possible to independently control the analog current setting and the digital driving, and when the analog current setting is performed in a given scanning line, the digital driving can be performed in another scanning line. When the analog current setting and the digital driving cannot be controlled independently, for example, the scanning lines are sequentially set one by one to the analog current setting, and during that time, the digital driving is not performed, and the digital driving is performed after the analog current setting has ended for all of the scanning lines. Since the length of one frame is determined by a frame rate, the digital driving period in one frame is shortened, and a scanning line driving frequency increases correspondingly. According to the embodiment, it is not necessary to separate the analog current setting and the digital driving, it is thus possible to perform the digital driving over the entire one frame, and the scanning line driving frequency can therefore be reduced.

8. Electronic Apparatus

Figure 18:
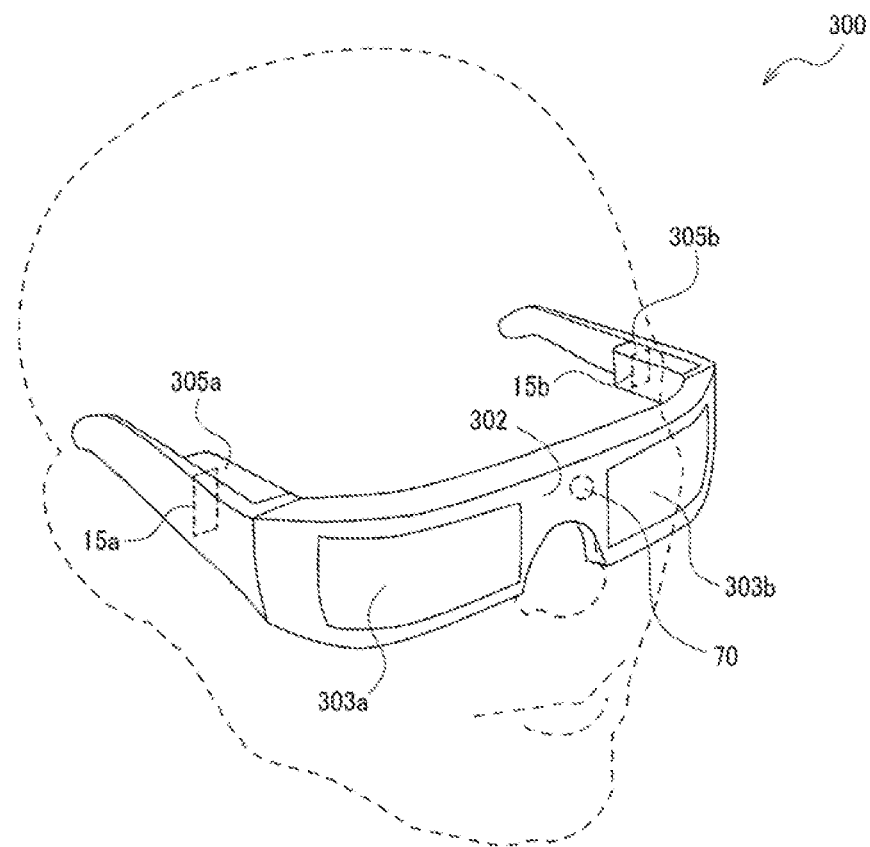
FIG. 18 is a configuration example of an electronic apparatus.

FIG. 18 is a configuration example of an electronic apparatus 300 that includes electro-optical devices 15a and 15b. Each of the electro-optical devices 15a and 15b corresponds to the electro-optical device 15 illustrated in FIG. 3 or FIG. 12. Here, a case in which the electronic apparatus is a head-mounted display is described as an example, but the present disclosure is not limited thereto, and various devices for displaying video using the electro-optical device can be assumed as the electronic apparatus. For example, the electronic apparatus may be an electronic viewfinder, a projector, a head-up display, a personal digital assistant, a television device, an on-board display, or the like.

The head-mounted display has an eyeglass-like appearance and allows the user wearing the head-mounted display to view image light superimposed on external light. The electronic apparatus 300 that is the head-mounted display includes transparent members 303a and 303b, a frame 302, projection devices 305a and 305b, and a sensor 70.

The frame 302 supports the transparent members 303a and 303b and the projection devices 305a and 305b. By mounting the frame 302 on the user's head, the head-mounted display is mounted on the user's head. The transparent member 303a is provided at a right eye portion of the frame 302, and the transparent member 303b is provided at a left eye portion of the frame 302. The transparent members 303a and 303b transmit the external light, thus allowing the user to view the external light. The projection device 305a is provided from a right temple portion to the right eye portion of the frame 302, and the projection device 305b is provided from a left temple portion to the left eye portion of the frame 302. The projection devices 305a and 305b cause light to be incident on the user's eyes so that the image light superimposed on the external light is visible to the user.

The projection device 305a includes the electro-optical device 15 a. As described with reference to FIG. 3, the electro-optical device 15a includes the circuit device 100 and the pixel array 20. The projection device 305a includes an optical system (not illustrated) that causes the image displayed in the pixel array 20 to be incident on the user's eye. The optical system includes, for example, a lens and a light-guiding member that reflects image light on an inner surface thereof. A configuration is adopted in which the image light is focused by refraction by the lens, and by curvature by a reflective surface of the light-guiding member. Similarly, the projection device 305b includes the electro-optical device 15b and an optical system (not illustrated).

The sensor 70 measures the luminance information of the environment. The sensor 70 is provided, for example, on a coupling portion that couples the right eye portion and the left eye portion of the frame 302. The sensor 70 is, for example, a photodiode, but an image sensor provided for photography may also serve as the sensor 70. In this case, the luminance information is acquired from an image captured by the image sensor.

The electro-optical device according to the embodiment described above includes the plurality of digital scanning lines, the digital signal line, the plurality of pixel circuits, and the control line driving circuit configured to output the enable signal. Each pixel circuit is electrically connected to a digital scanning line included in the plurality of digital scanning lines, and to the digital signal line. Each pixel circuit includes the light emitting element and the digital driving circuit. The digital driving circuit performs the digital driving in which the display data is set from the digital signal line when the digital driving circuit is selected by the digital scanning line, and the light emitting element is turned on or off based on the grayscale value of the display data. The digital driving circuit keeps the light emitting element on by supplying the drive current to the light emitting element, in the period in which the enable signal is active, of the grayscale display period having the length corresponding to the grayscale value of the display data. The control line driving circuit variably sets the period in which the enable signal is active. With respect to the grayscale display period, the ratio of the ON-state period in which the light emitting element 31 is ON-state changes in accordance with the period in which the enable signal is active.

According to the embodiment, in the digital driving, of the grayscale display period having the length corresponding to the grayscale value of the display data, the light emitting element is ON-state in the ON-state period of the ratio set by the control line driving circuit. In this way, by adjusting the ratio of the ON-state period with respect to the grayscale display period, the display luminance is adjusted, and thus it is possible to use all of the gradations even in the dark environment. As a result, it is possible to both adjust the display luminance in accordance with the brightness of the environment and achieve the favorable grayscale display.

Further, in the embodiment, the electro-optical device may include the scanning line driving circuit configured to drive the plurality of digital scanning lines, The field constituting one image may include the first to n-th scanning line selection periods in which the first to n-th bits of the display data (n is an integer of 2 or more) are written to the pixel circuit, and the first to n-th display periods in which the light emitting element is turned on or off in accordance with the first to n-th bits set to the pixel circuit. n is an integer equal to or greater than 2. The grayscale display period having the length corresponding to the grayscale value of the display data may be a display period, of the first to n-th display periods, corresponding to the scanning line selection period in which is set the bit indicating ON-state of the light emitting element.

According to the embodiment, the display period corresponding to the scanning line selection period in which is set the bit indicating ON-state of the light emitting element indicates the period in which the light emitting element is ON-state, in the normal digital driving. In the embodiment, of that grayscale display period, the light emitting element is ON-state in the ON-state period of the ratio set by the control line driving circuit. In this way, it is possible to adjust the display luminance while securing the number of gradations of the grayscale display in the digital driving.

Further, in the embodiment, in each display period of the first to n-th display periods, the control line driving circuit may cause the enable signal to be active at the ratio.

According to the embodiment, a period that is the display period corresponding to the scanning line selection period in which the bit indicating ON-state of the light emitting element is set, and is the period in which the enable signal is active at the ratio set by the control line driving circuit is the ON-state period in which the light emitting element 31 is ON-state. The ratio occupied by the ON-state period in each of the display periods is constant, and by adjusting that ratio, the length of the ON-state period is adjusted and the display luminance is adjusted.

Further, the electro-optical device according to the embodiment may include the digital signal line driving circuit configured to output the first to n-th bits to the digital signal line. In each scanning line selection period of the first to n-th scanning line selection periods, the digital signal line driving circuit may change, in accordance with the ratio, the allocation of which one of the bits, of the first to n-th bits, is set to the pixel circuit. In each display period of the first to n-th display periods, the control line driving circuit may cause the enable signal to be active in the period having the length corresponding to the allocation.

According to the embodiment, the allocation of which bit, of the first to n-th bits, is set to the pixel circuit in each of the scanning line selection periods is changed in accordance with the ratio, and, of each of the display periods, the enable signal is activated in the period of the length set in accordance with the allocation. The ratio occupied by the on period in each of the display periods is not constant, but by changing the allocation and adjusting the period in which the enable signal is active, the length of the on period is adjusted and the display luminance is adjusted.

Further, in the embodiment, the field may include the plurality of subfields. In the subfield included in the plurality of subfields, the scanning line drive circuit may select, the one time, the one scanning line group that is the selection target, from among the plurality of digital scanning lines. The scanning line group may include the digital scanning line electrically connected to the pixel circuit to which the i-th bit, of the first to n-th bits of display data, is set in the subfield, and the digital scanning line electrically connected to the pixel circuit to which the j-th bit, of the first to n-th bits of display data, is set in the subfield. i is an integer equal to or greater than 1 and equal to or less than n, and j is an integer equal to or greater than 1 and equal to or less than n, and is different from i.

According to the embodiment, the i-th bit is set to the one scanning line in the one subfield, and the j-th bit is set to another of the scanning lines. In this way, a non-scanning period in which the scanning line is not selected can be reduced, and the scanning line drive frequency can be decreased compared to the known method.

Further, in the embodiment, each of the subfields of the plurality of subfields may be a period of the same length.

Further, in the embodiment, in the subfield, the scanning line driving circuit may select, as the scanning line group, the n digital scanning lines from the digital scanning line electrically connected to the pixel circuit to which the first bit is to be set, to the digital scanning line electrically connected to the pixel circuit to which the n-th bit is to be set.

Each of the subfields being the period of the same length means that the number of scanning lines of the selected scanning line group is the same in each of the subfields. Then, the same number of scanning lines as the number of bits of the display data are selected while being shifted for each of the subfields until one cycle is completed. As a result, the first to n-th bits are set into all of the scanning lines in the one frame.

Further, in the embodiment, in the field, the first to n-th bits of the display data may be set to each of the pixel circuits by the scanning line driving circuit selecting each of the digital scanning lines, of the plurality of digital scanning lines, n times each.

When focusing on the one scanning line, the first to n-th scanning line selection periods and the first to n-th display periods are required in the one field. According to the embodiment, each of the scanning lines is selected n times, and the first to n-th bits are set to those scanning lines. In this way, in the one field, the first to n-th scanning line selection periods and the first to n-th display periods are realized for all of the scanning lines.

Further, in the embodiment, the electro-optical device may include the plurality of analog scanning lines and the analog signal line. Each pixel circuit is electrically connected to an analog scanning line included in the plurality of analog scanning lines, and to the analog signal line. Each pixel circuit may include the analog driving circuit. The analog driving circuit may be configured to perform the analog current setting in which the analog data voltage is set from the analog signal line when the analog driving circuit is selected by the analog scanning line, and a current value of the drive current is variably set based on the analog data voltage. In the on period, the digital driving circuit may supply the drive current from the analog driving circuit to the light emitting element.

According to the embodiment, the analog driving circuit variably adjusts the drive current, and the digital driving circuit performs the digital driving of the light emitting element using that drive current. As a result, the display luminance when the light emitting element is on is adjusted. In this way, as well as adjusting the display luminance using the enable signal, the display luminance adjustment can be performed by the analog current setting, and thus the adjustment width of the display luminance is further increased, in comparison to when the adjustment of the display luminance is performed using only the enable signal.

Further, in the embodiment, in the period in which, of the plurality of pixel circuits, the s-th pixel circuit electrically connected to the s-th digital scanning line and the s-th analog scanning line (s is an integer of 1 or more) performs the analog current setting, of the plurality of pixel circuits, the t-th pixel circuit electrically connected to the t-th digital scanning line and the t-th analog scanning line (t is an integer of 1 or more) performs the digital driving. s is an integer equal to or greater than 1, and t is an integer equal to or greater than 1 and different from s.

According to the embodiment, the analog scanning line and the analog signal line are provided with respect to the analog driving circuit, and the digital scanning line and the digital signal line are provided with respect to the digital driving circuit. In this way, it is possible to independently control the analog current setting and the digital driving, and when the analog current setting is performed in the given scanning line, the digital driving can be performed in the other scanning line. In this way, it is not necessary to separate the analog current setting and the digital driving, and thus it is possible to perform the digital driving over the entire one frame, and to reduce the scanning line drive frequency.

Further, in the embodiment, the digital driving circuit may include a storage circuit configured to store the display data, and a first drive transistor and a second drive transistor provided in series between a supply node of the drive current and an end of the light emitting element. The first drive transistor may be turned on or off based on the output signal from the storage circuit. The second drive transistor may be turned on or off based on the enable signal. When the first drive transistor and the second drive transistor are ON-state, the drive current may be supplied to the light emitting element.

According to the embodiment, the drive current is supplied to the light emitting device when the first drive transistor is turned on based on the output signal from the storage circuit and the second drive transistor is turned on based on the enable signal. In this way, the control line driving circuit is able to adjust the length of the period in which the second drive transistor is turned on by the enable signal, and thus, the ratio occupied by the ON-state period of the grayscale display period can be adjusted.

Further, in the embodiment, ratio setting information may be input to the control line driving circuit and the control line driving circuit may set the ratio based on the ratio setting information, the ratio setting information being based on luminance information of the environment and causing the ratio to be smaller the lower the luminance of the environment.

In this way, the display luminance is adjusted based on the luminance information of the environment. In other words, the lower the luminance of the environment, the smaller the ratio occupied by the ON-state period in the grayscale display period. Thus, the light emission luminance of the light emitting element in a time average within the frame becomes lower.

Further, in the embodiment, the electronic apparatus includes any one of the electro-optical devices described above.

Further, the electronic apparatus according to the embodiment may include any one of the electro-optical devices described above, and the sensor that measures the luminance information.

Although the embodiment has been described in detail above, those skilled in the art will easily understand that many modified examples can be made without substantially departing from novel items and effects of the present disclosure. All such modified examples are thus included in the scope of the disclosure. For example, terms in the descriptions or drawings given at least once along with different terms having identical or broader meanings can be replaced with those different terms in all parts of the descriptions or drawings. All combinations of the embodiment and the modified examples are also included within the scope of the present disclosure. Further, the configurations, operations, and the like of the circuit device, the pixel array, the display controller, the display system, the sensor, the electro-optical device, the electronic apparatus, and the like are not limited to those described in the embodiment, and various modifications thereof are possible.

What is claimed is:

1. An electro-optical device comprising:
   a plurality of digital scanning lines;
   a digital signal line;
   a plurality of pixel circuits; and
   a control line driving circuit configured to output an enable signal, wherein
   each pixel circuit of the plurality of pixel circuits includes
   a light emitting element, and
   a digital driving circuit configured to perform digital driving in which display data is set through the digital signal line when the digital driving circuit is selected through one of the digital scanning lines of the plurality of digital scanning lines, and the light emitting element is ON-state or OFF-state based on a grayscale value of the display data,
   each pixel circuit is electrically connected to a digital scanning line included in the plurality of digital scanning lines, and to the digital signal line,
   the digital driving circuit keeps the light emitting element ON-state by supplying a drive current to the light emitting element, in a period in which the enable signal is active, of a grayscale display period having a length corresponding to the grayscale value of the display data,
   the control line driving circuit variably sets the period in which the enable signal is active, and
   a ratio, with respect to the grayscale display period, of an ON-state period in which the light emitting element is ON-state changes in accordance with the period in which the enable signal is active.

2. The electro-optical device according to claim 1, comprising:
   a scanning line driving circuit configured to drive the plurality of digital scanning lines, wherein
   a field constituting one image includes first to n-th scanning line selection periods in which first to n-th bits of the display data are set to the pixel circuit, n being an integer of 2 or more, and first to n-th display periods in which the light emitting element is ON-state or OFF-state in accordance with the first to n-th bits set to the pixel circuit, and
   the grayscale display period having the length corresponding to the grayscale value of the display data is a display period, of the first to n-th display periods, corresponding to the scanning line selection period in which is set one bit of the first to n-th bits indicating ON-state of the light emitting element.

3. The electro-optical apparatus according to claim 2, wherein
   in each display period of the first to n-th display periods, the control line driving circuit causes the enable signal to be active at the ratio.

4. The electro-optical apparatus according to claim 2, comprising:
   a digital signal line driving circuit configured to output the first to n-th bits to the digital signal line, wherein
   in each scanning line selection period of the first to n-th scanning line selection periods, the digital signal line driving circuit changes, in accordance with the ratio, an allocation of which one of the bits, of the first to n-th bits, is set to the pixel circuit, and
   in each display period of the first to n-th display periods, the control line driving circuit causes the enable signal to be active in a period having a length corresponding to the allocation.

5. The electro-optical device according to claim 2, wherein
   the field includes a plurality of subfields,
   in a subfield included in the plurality of subfields, the scanning line driving circuit selects, one time, a scanning line group as a selection target, among the plurality of digital scanning lines, and
   the scanning line group includes a digital scanning line electrically connected to a pixel circuit to which an i-th bit is to be set, of the first to n-th bits of the display data in the subfield, i being an integer from 1 to n, and a digital scanning line electrically connected to a pixel circuit to which a j-th bit is to be set, of the first to n-th bits of the display data in the subfield, j being an integer of 1 to n and different from i.

6. The electro-optical device according to claim 5, wherein
   each subfield of the plurality of subfields is a period of the same length.

7. The electro-optical device according to claim 5, wherein
   in the subfield, the scanning line driving circuit selects, as the scanning line group, n digital scanning lines from a digital scanning line electrically connected to a pixel circuit to which the first bit is to be set, to a digital scanning line electrically connected to a pixel circuit to which the n-th bit is to be set.

8. The electro-optical device according to claim 5, wherein the first to n-th bits of the display data are set to each pixel circuit by the scanning line driving circuit selecting each digital scanning line, of the plurality of digital scanning lines, n times each in the field.

9. The electro-optical apparatus according to claim 1, comprising:

a plurality of analog scanning lines; and an analog signal line, wherein each pixel circuit is electrically connected to an analog scanning line included in the plurality of analog scanning lines, and to the analog signal line, each pixel circuit includes an analog driving circuit configured to perform analog current setting in which an analog data voltage is set from the analog signal line when the analog driving circuit is selected by the analog scanning line, and a current value of the drive current is variably set based on the analog data voltage, and in the ON-state period, the digital driving circuit supplies the drive current from the analog driving circuit to the light emitting element.

10. The electro-optical device according to claim 9, wherein in a period in which an s-th pixel circuit, of the plurality of pixel circuits, electrically connected to an s-th digital scanning line and an s-th analog scanning line performs the analog current setting, a t-th pixel circuit, of the plurality of pixel circuits, electrically connected to a t-th digital scanning line and a t-th analog scanning line performs the digital driving, s being an integer of 1 or more, t being an integer of 1 or more and different from s.

11. The electro-optical device according to claim 1, wherein the digital driving circuit includes a storage circuit configured to store the display data, and a first drive transistor and a second drive transistor provided in series between a supply node of the drive current and an end of the light emitting element, the first drive transistor is ON-state or OFF-state based on an output signal from the storage circuit, the second drive transistor is ON-state or OFF-state based on the enable signal, and when the first drive transistor and the second drive transistor are ON-state, the drive current is supplied to the light emitting element.

12. The electro-optical apparatus according to claim 1, wherein the control line driving circuit, to which ratio setting information based on luminance information of environment is input, sets the ratio based on the ratio setting information, the ratio setting information being configured to cause the ratio to be smaller the lower the luminance of the environment.

13. An electronic apparatus comprising:

the electro-optical device according to claim 12; and a sensor configured to measure the luminance information.

14. An electronic apparatus comprising:

the electro-optical device according to claim 1.

* * * * *